US011381185B2

(12) United States Patent
Oonishi et al.

(10) Patent No.: US 11,381,185 B2
(45) Date of Patent: Jul. 5, 2022

(54) POWER CONTROL CIRCUIT AND POWER GENERATION SYSTEM INCLUDING THE SAME

(71) Applicant: KABUSHIKI KAISHA TOSHIBA, Tokyo (JP)

(72) Inventors: Atsuro Oonishi, Tokyo (JP); Yoshiyuki Ishihara, Kawasaki Kanagawa (JP); Hiroshi Takahashi, Yokohama Kanagawa (JP); Takeshi Ueno, Kawasaki Kanagawa (JP)

(73) Assignee: KABUSHIKI KAISHATOSHIBA, Tokyo (JP)

( * ) Notice: Subject to any disclaimer, the term of this patent is extended or adjusted under 35 U.S.C. 154(b) by 774 days.

(21) Appl. No.: 16/299,627

(22) Filed: Mar. 12, 2019

(65) Prior Publication Data

US 2019/0379227 A1    Dec. 12, 2019

(30) Foreign Application Priority Data

Jun. 8, 2018  (JP) .............................. JP2018-110315
Mar. 8, 2019  (JP) .............................. JP2019-042710

(51) Int. Cl.
| *H02P 9/00* | (2006.01) |
| *H02J 7/00* | (2006.01) |
| *H02M 3/158* | (2006.01) |
| *H02J 7/34* | (2006.01) |
| *H02M 1/00* | (2006.01) |
| *H02N 2/18* | (2006.01) |
| *G05F 1/67* | (2006.01) |

(Continued)

(52) U.S. Cl.
CPC ................ *H02P 9/00* (2013.01); *G01R 21/06* (2013.01); *G05F 1/67* (2013.01); *H02J 7/0068* (2013.01); *H02M 3/1582* (2013.01); *G05F 5/00* (2013.01); *H02J 7/345* (2013.01); *H02M 1/0003* (2021.05); *H02N 2/186* (2013.01); *H02P 2201/03* (2013.01)

(58) Field of Classification Search
CPC ....... H02P 9/00; H02P 2201/03; G01R 21/06; G05F 1/67; G05F 5/00; H02J 7/0068; H02J 7/345; H02J 7/32; H02M 3/1582; H02M 1/0003; H02M 3/156; H02N 2/186
See application file for complete search history.

(56) References Cited

U.S. PATENT DOCUMENTS

| 6,249,108 B1 * | 6/2001 | Smedley | ............... H02J 3/1842 |
| | | | 323/207 |
| 6,844,739 B2 * | 1/2005 | Kasai | ........................ H02J 7/35 |
| | | | 323/284 |

(Continued)

FOREIGN PATENT DOCUMENTS

| EP | 3432468 A1 * | 1/2019 | ......... H02K 11/0094 |
| JP | 2000-23365 A | 1/2000 | |

(Continued)

*Primary Examiner* — Pedro J Cuevas
(74) *Attorney, Agent, or Firm* — Finnegan, Henderson, Farabow, Garrett & Dunner L.L.P.

(57) ABSTRACT

A power control circuit includes a converter, a signal generation circuit, and control circuitry. The converter includes a switching circuit. The converter transforms an output voltage from a power generator. The signal generation circuit operates the switching circuit of the converter. The control circuitry changes an operation of the switching circuit.

18 Claims, 16 Drawing Sheets

(51) Int. Cl.
  *G01R 21/06* (2006.01)
  *G05F 5/00* (2006.01)

(56) References Cited

U.S. PATENT DOCUMENTS

| | | | | |
|---|---|---|---|---|
| 7,038,436 | B2* | 5/2006 | Goto | H02M 1/32 |
| | | | | 323/277 |
| 8,384,368 | B2* | 2/2013 | Osaka | H02M 3/156 |
| | | | | 323/224 |
| 9,215,772 | B2* | 12/2015 | Sood | H02M 7/04 |
| 9,692,298 | B2* | 6/2017 | Pregitzer | H05B 45/3575 |
| 10,411,612 | B2* | 9/2019 | Oonishi | H02J 50/001 |
| 10,615,726 | B2* | 4/2020 | Oonishi | H02P 9/009 |
| 10,742,106 | B2* | 8/2020 | Chen | G01R 31/42 |
| 2002/0163323 | A1* | 11/2002 | Kasai | H02J 7/35 |
| | | | | 323/284 |
| 2004/0263139 | A1* | 12/2004 | Goto | H02M 3/156 |
| | | | | 323/282 |
| 2009/0284240 | A1 | 11/2009 | Zhang et al. | |
| 2011/0018500 | A1* | 1/2011 | Takahashi | H02J 7/0072 |
| | | | | 320/148 |
| 2011/0075463 | A1* | 3/2011 | Osaka | H02M 3/156 |
| | | | | 363/127 |
| 2012/0212985 | A1 | 8/2012 | Lee et al. | |
| 2013/0141068 | A1* | 6/2013 | Kay | H02M 1/14 |
| | | | | 323/282 |
| 2014/0056043 | A1 | 2/2014 | Naito et al. | |
| 2014/0118413 | A1* | 5/2014 | Park | H02M 3/156 |
| | | | | 345/82 |
| 2016/0079791 | A1 | 3/2016 | Kim et al. | |
| 2016/0134189 | A1* | 5/2016 | Pregitzer | H05B 39/044 |
| | | | | 323/283 |
| 2016/0276915 | A1* | 9/2016 | Oonishi | H02K 7/116 |
| 2017/0063147 | A1 | 3/2017 | Nakayama et al. | |
| 2017/0346416 | A1 | 11/2017 | Rutgers et al. | |
| 2017/0366077 | A1 | 12/2017 | Oonishi et al. | |
| 2018/0278170 | A1 | 9/2018 | Oonishi et al. | |
| 2019/0028049 | A1* | 1/2019 | Oonishi | H02K 11/30 |
| 2019/0074758 | A1* | 3/2019 | Chen | H02M 1/32 |
| 2020/0186033 | A1* | 6/2020 | Lee | H02J 7/025 |
| 2020/0358353 | A1* | 11/2020 | Hartman | H02M 3/156 |
| 2021/0057995 | A1* | 2/2021 | Kai | H02M 3/01 |
| 2021/0075244 | A1* | 3/2021 | Cho | H02J 7/00032 |
| 2021/0079900 | A1* | 3/2021 | Oonishi | H02K 35/00 |
| 2021/0167691 | A1* | 6/2021 | Chen | H02M 1/08 |
| 2021/0305900 | A1* | 9/2021 | Hosokawa | H02M 1/32 |

FOREIGN PATENT DOCUMENTS

| | | |
|---|---|---|
| JP | 2012-173773 A | 9/2012 |
| JP | 2012-181608 A | 9/2012 |
| JP | 5361994 | 12/2013 |
| JP | 2017-229118 | 12/2017 |
| JP | 2018-501760 A | 1/2018 |
| JP | 2018-157724 | 10/2018 |
| JP | 2019-022409 | 2/2019 |
| WO | WO 2013/136691 A1 | 9/2013 |
| WO | WO 2015/046594 A1 | 4/2015 |
| WO | WO 2015/133136 | 9/2015 |

* cited by examiner

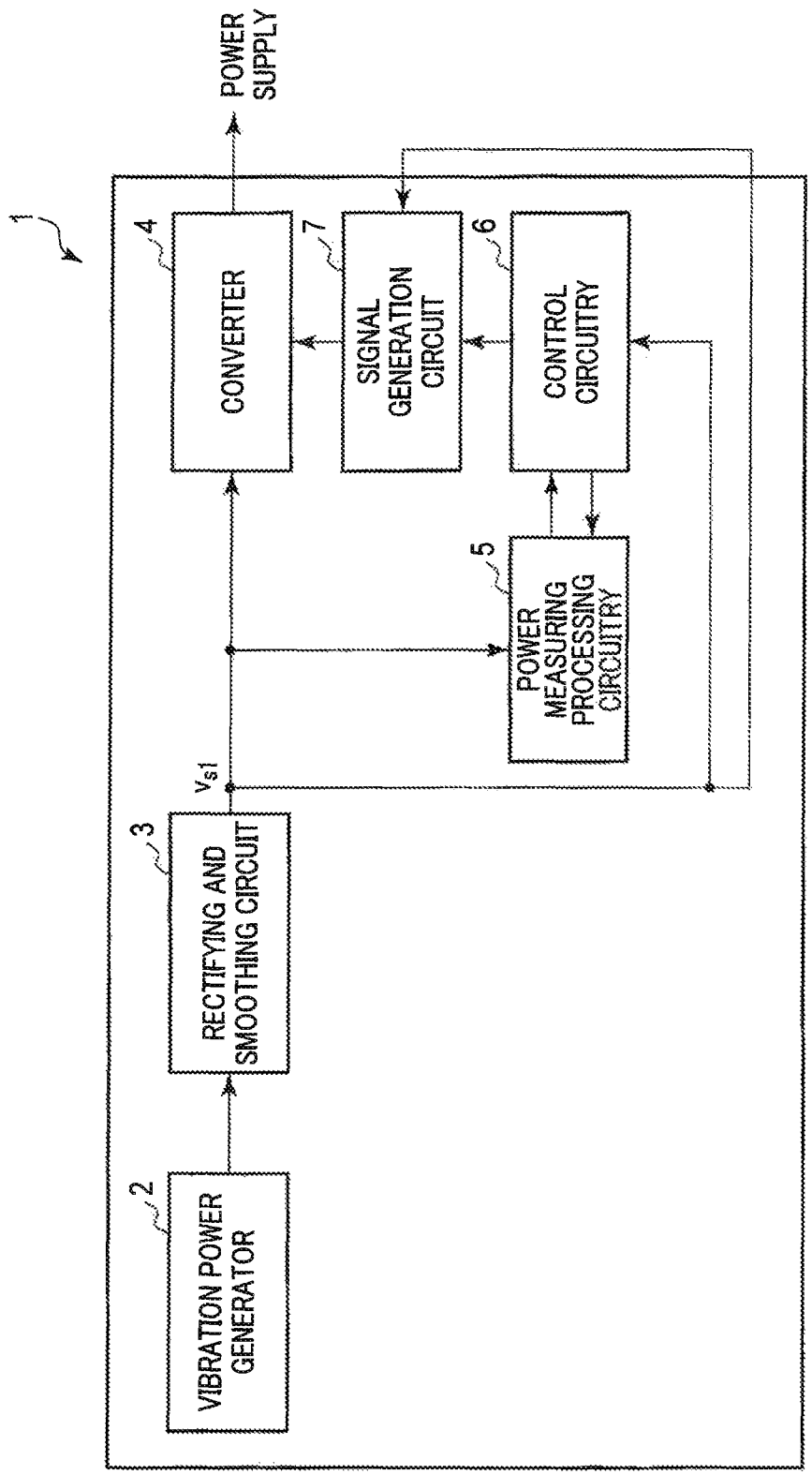
F I G. 1

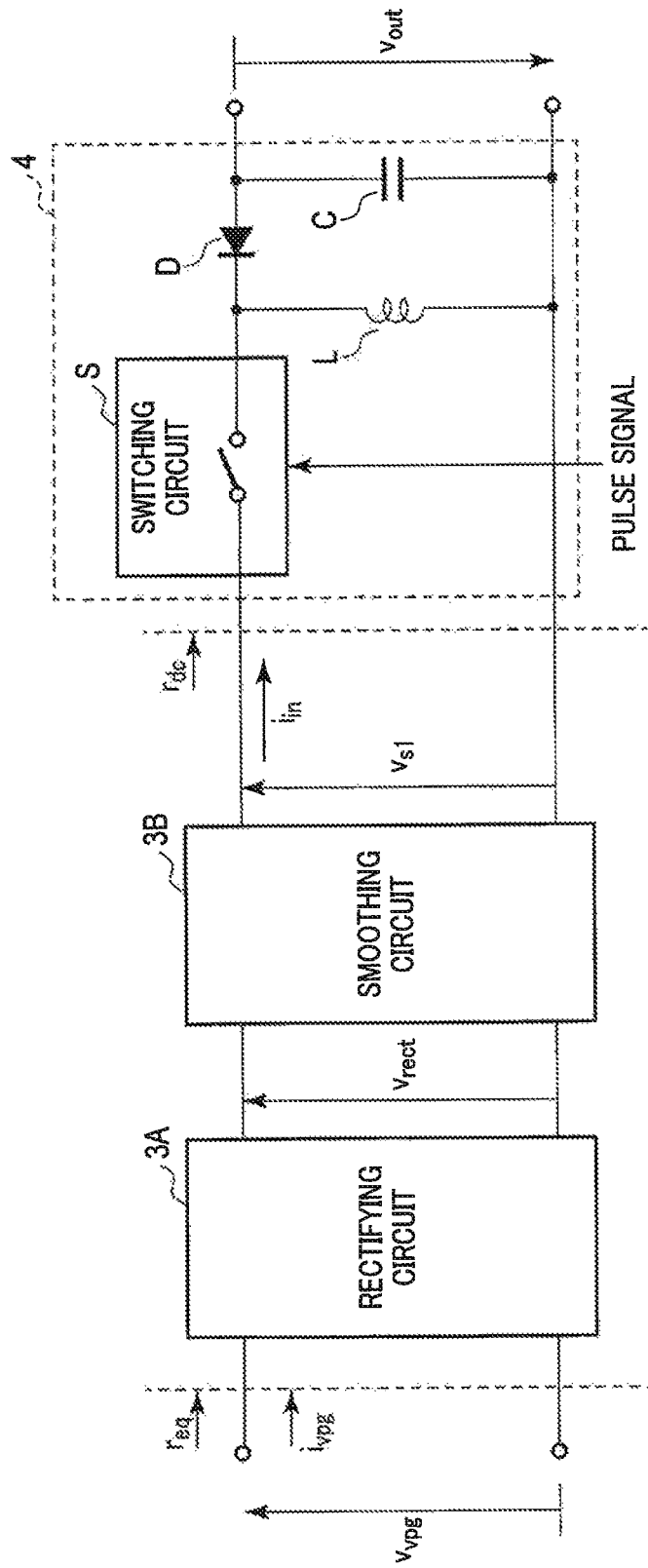
F I G. 2A

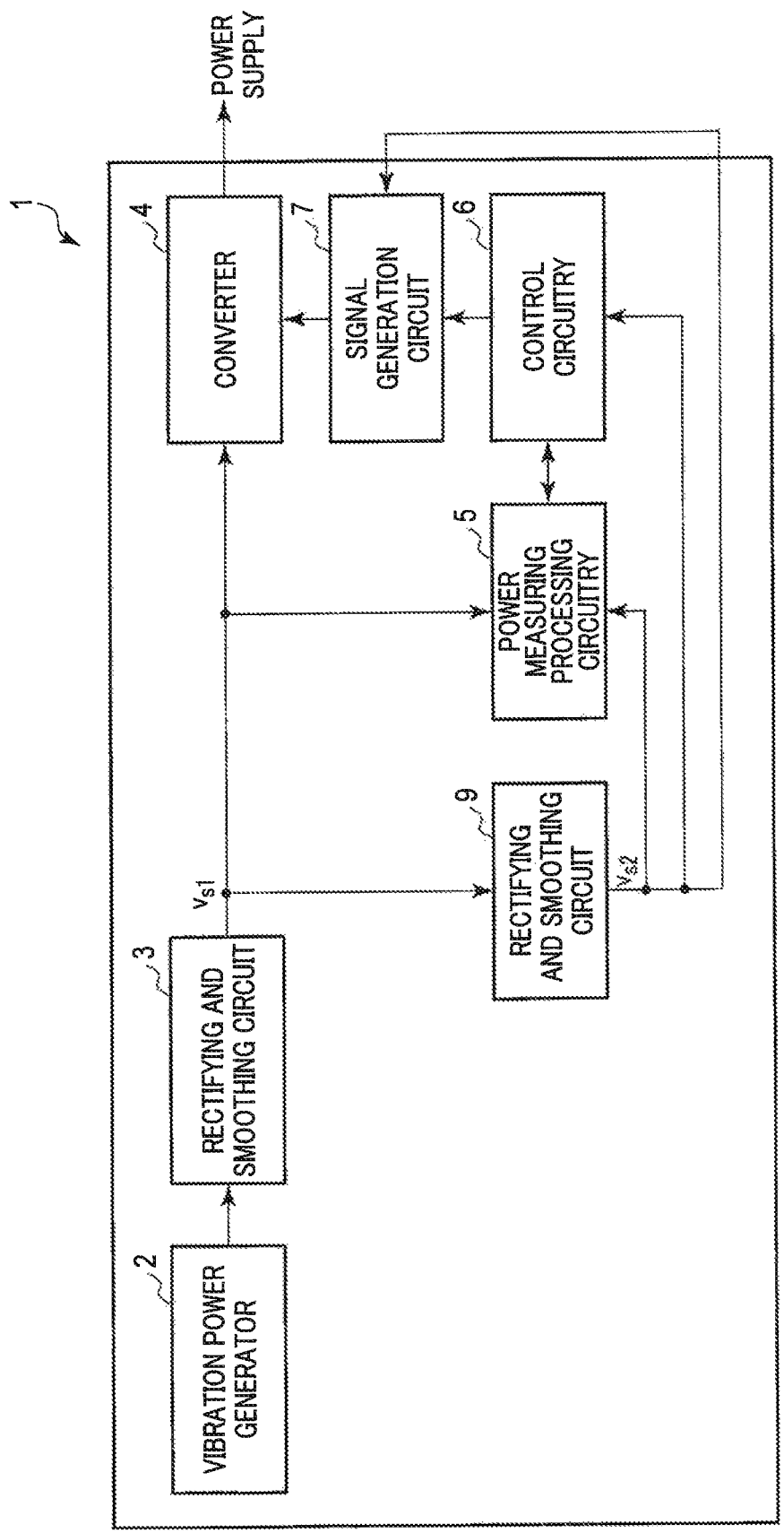
F I G. 6

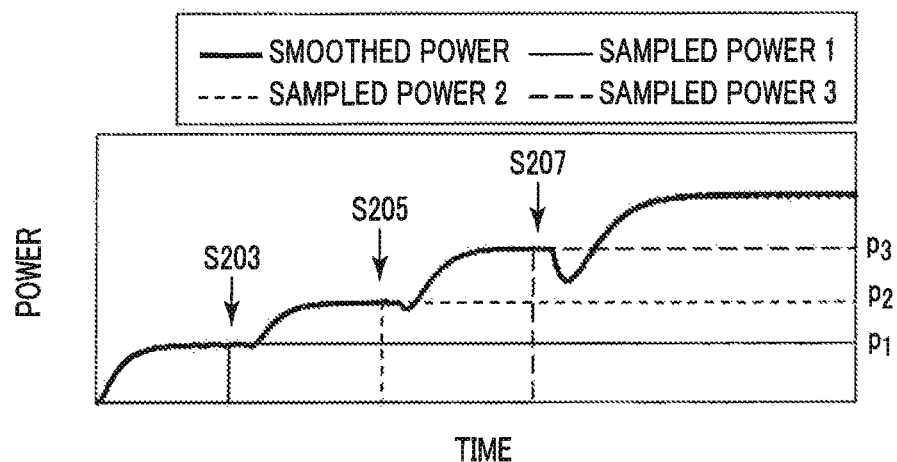
F I G. 10A
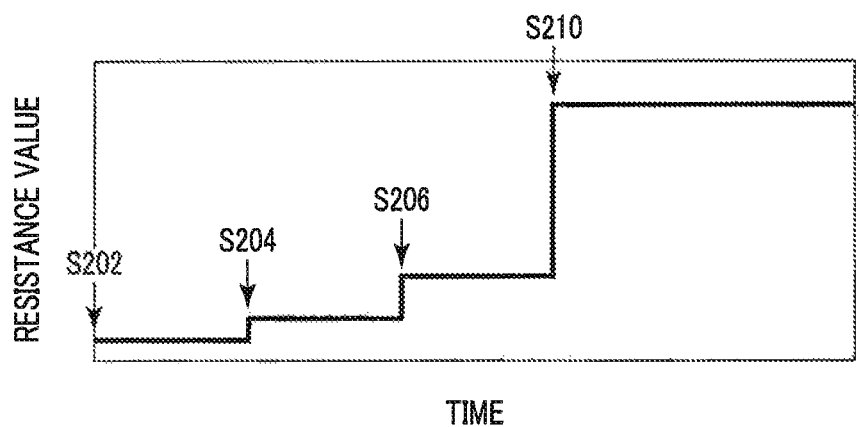
F I G. 10B

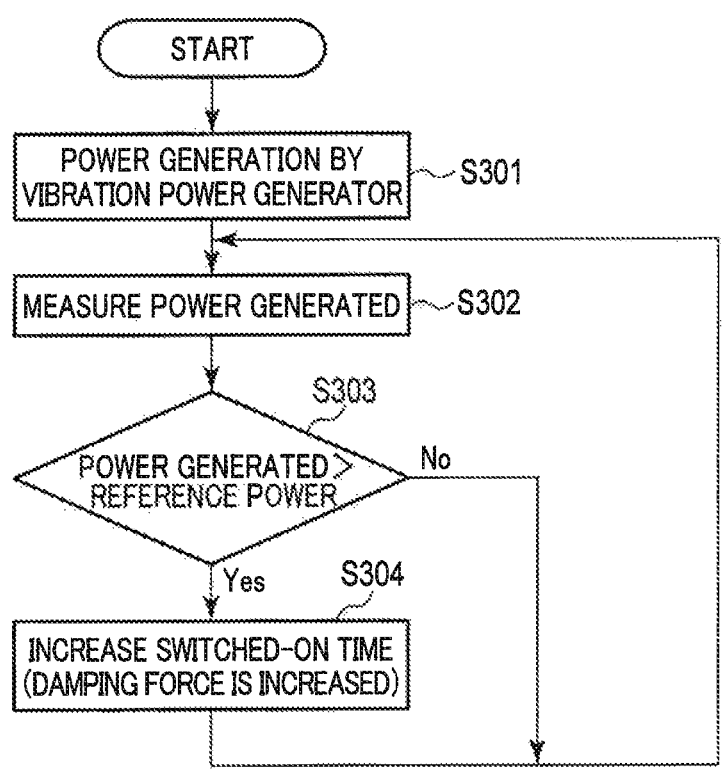
F I G. 13

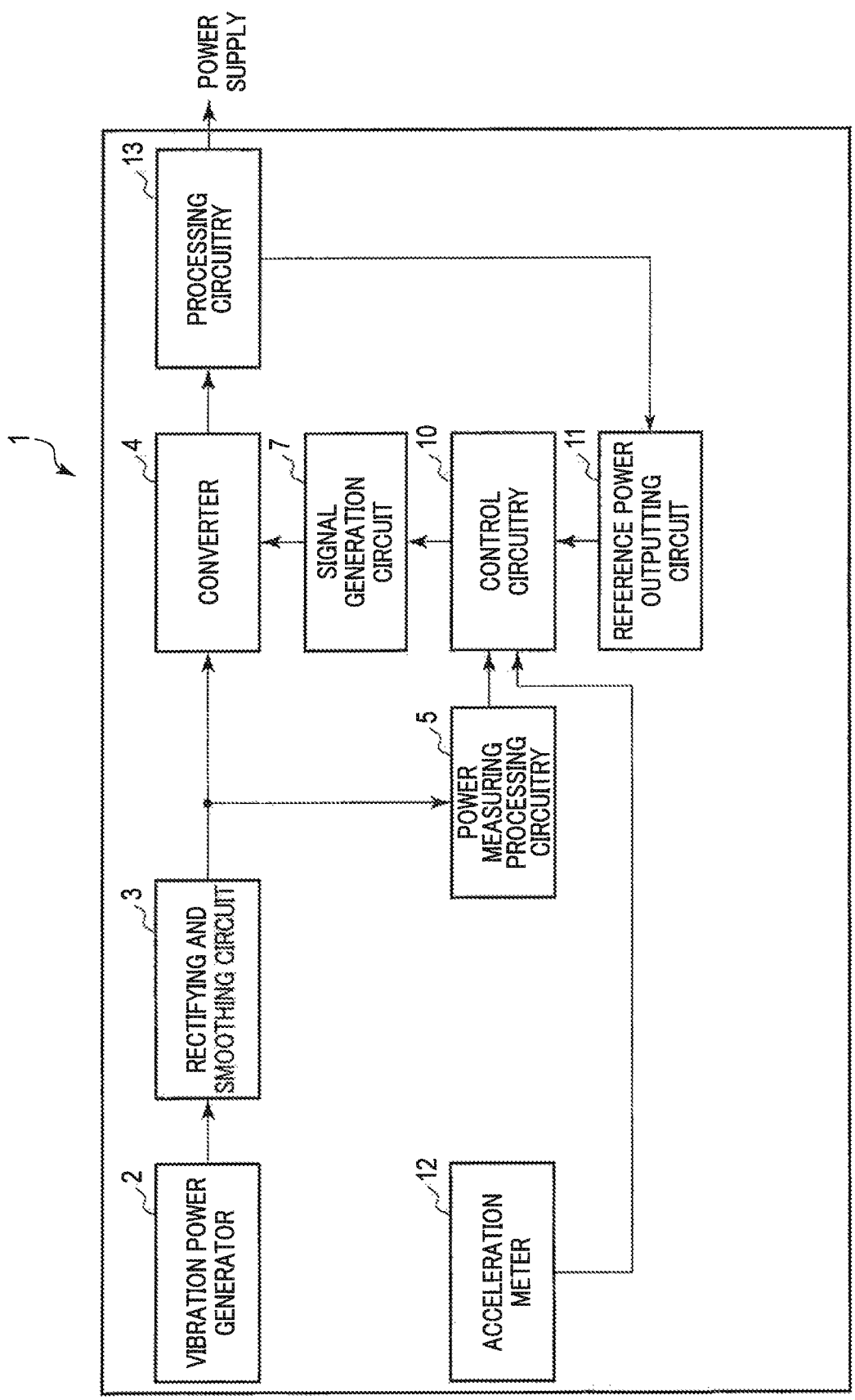
F I G. 15

POWER CONTROL CIRCUIT AND POWER GENERATION SYSTEM INCLUDING THE SAME

CROSS-REFERENCE TO RELATED APPLICATIONS

This application is based upon and claims the benefit of priority from the Japanese Patent Application No. 2018-110315, filed Jun. 8, 2019, and No. 2019-042710, filed Mar. 8, 2019, the entire contents of both of which are incorporated herein by reference.

FIELD

Embodiments described herein relate to power control circuit and power generation system including the same.

BACKGROUND

Vibration power generators are power generators that convert mechanical energy produced by mechanical vibrations into electrical energy, and thereby generate power. With a vibration power generator, electric power can be obtained from ambient vibrations. Ambient vibrations refer to the various vibrations produced the course of everyday life. For example, vibrations from a vehicle such as an automobile or a train, or vibrations produced when rain strikes the ground. The power generated by a vibration power generator shows promise as an alternative power source (for example, a battery) to be used in devices such as sensors.

In order to maximize the power generated by a vibration power generator, the equivalent resistance of electrical circuitry connected to the vibration power generator should be set to an appropriate value that corresponds to the ambient vibrations. Maximum power point tracking control, which is used in solar power generation and the like, is one known control method for setting an equivalent resistance to an optimum value. It should be noted that power measurements are vital for maximum power point tracking control. Typically, power is calculated by measuring voltage and current and then multiplying the measured voltage and current together. However, since the power required for current measurements is greater than the power generated by vibration power generators, it is difficult to measure current in vibration power generators.

The present embodiments provide a power control circuit that can perform maximum power point tracking control with low power consumption, and a power generation system including the same.

BRIEF DESCRIPTION OF THE DRAWINGS

FIG. 1 is a block diagram illustrating a power generation system according to a first embodiment;

FIG. 2A is a diagram illustrating an example of an electrical circuit combining a rectifying and smoothing circuit with a converter;

FIG. 6 is a block diagram illustrating a power generation system according to a second modified example of the first embodiment;

FIG. 10A is a graph of smoothed power measured based on a smoothed voltage from the vibration power generator of the second embodiment, and of sampled powers sampled from the smoothed power at a certain time interval;

FIG. 10B is a graph illustrating changes in the equivalent resistance of a circuit over time.

FIG. 13 is a flowchart illustrating an operating procedure for a power generation system according to the third embodiment.

FIG. 15 is a block diagram illustrating a power generation system according to a first modified example of the third embodiment.

DETAILED DESCRIPTION

Figure 2B:
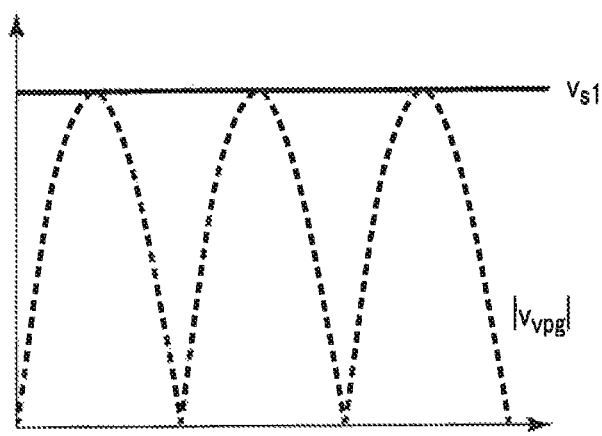
FIG. 2B is a diagram illustrating an output voltage from a rectifying circuit and an output voltage from a smoothing circuit.

Embodiments will be described below, with reference to the drawings. Configuration that is the same throughout the embodiments described below will be denoted using identical reference numerals, and duplicate description thereof will not be given. Note that the drawings are schematically or conceptually illustrated.

According to one embodiment, a power control circuit includes a converter, a signal generation circuit, and control circuitry. The converter includes a switching circuit. The converter transforms an output voltage from a power generator. The signal generation circuit operates the switching circuit of the converter. The control circuitry changes an operation of the switching circuit.

First Embodiment

FIG. 1 is a block diagram illustrating a power generation system 1 according to a first embodiment. As illustrated in FIG. 1, the power generation system 1 comprises a power generator and a power control circuit. The power generator includes, for example, a vibration power generator 2. The power control circuit includes, for example, a rectifying and smoothing circuit 3, a converter 4, power measuring processing circuitry 5, control circuitry 6, and a signal generation circuit 7. This power generation system 1 is connected to a load and supplies power to the load. The load is any device, such as a sensor, and the load receives, and is driven by, power supplied from the power generation system 1.

The vibration power generator 2 is, for example, provided with an electromagnetic induction element and a piezoelectric element, and converts mechanical energy from mechanical vibration due to ambient vibrations or the like into AC power, and outputs this AC power.

The rectifying and smoothing circuit 3, serving a first rectifying and smoothing circuit, converts the AC power output from the vibration power generator 2 into DC power (first DC power), and then the rectifying and smoothing circuit 3 smooths this DC power. The rectifying and smoothing circuit 3 includes, for example, a rectifying circuit and a smoothing circuit. The rectifying circuit converts the AC power output from the vibration power generator 2 into DC power. When the power generator is a vibration power generator, the DC power output from the rectifying circuit is normally pulsed DC. The rectifying circuit includes, for example, one or more diode. For example, the rectifying circuit may include four bridge-connected diodes in a full-wave rectifier configuration. The smoothing circuit smooths the DC power output from the rectifying circuit. The smoothing circuit includes, for example, one capacitor. The smoothing circuit may include a plurality of capacitors. The smoothing circuit may also include a combination of capacitors and inductors. The smoothing circuit smooths voltages by temporarily accumulating current as charge, and then releasing the accumulated charge. Namely, the smoothing circuit is a kind of storage circuit that accumulates power.

The converter 4 includes a switching circuit (also called a switching element), and transforms DC power output from the rectifying and smoothing circuit 3 based on a switching operation of the switching circuit. The switching circuit is driven using a pulse signal (square wave) from the signal generation circuit 7. The switching circuit includes, for example, a bipolar transistor or a metal-oxide semiconductor field-effect transistor (MOSFET). Power output from the converter 4 is supplied, as appropriate, to a load connected to the power generation system 1, in other words, to a device such as a sensor.

FIG. 2A illustrates an example of an electrical circuit combining the rectifying and smoothing circuit 3 with the converter 4. FIG. 2A illustrates an example in which the converter 4 is a buck-boost converter.

The rectifying and smoothing circuit 3 includes a rectifying circuit 3A and a smoothing circuit 3B. FIG. 2B illustrates both output voltage from the rectifying circuit 3A and output from the smoothing circuit 3B. For example, when the rectifying circuit 3A includes a full-wave rectifier, a voltage $V_{vpg}$ from the vibration power generator 2 is full-wave rectified by the rectifying circuit 3A as illustrated in FIG. 2B. An output voltage $v_{rect}$ from the rectifying circuit 3A is also smoothed by the smoothing circuit 3B as illustrated by the output voltage $v_{s1}$ in FIG. 2B.

Figure 2C:
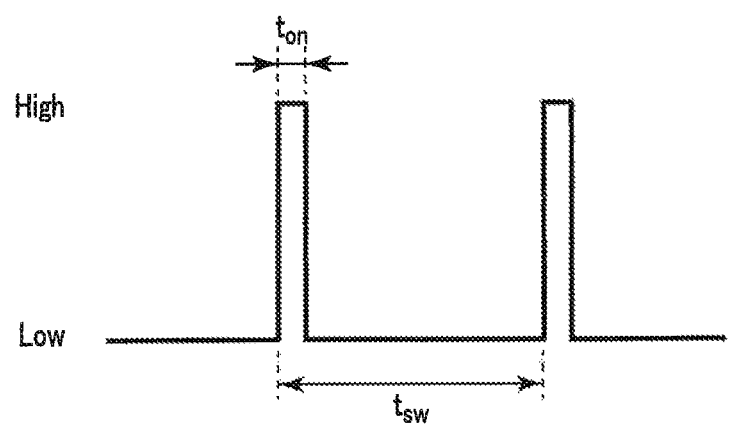
FIG. 2C is a diagram illustrating an example of a pulse signal for driving a converter.

A buck-boost converter is a converter that is able to both raise and lower voltages using the switching of the switching circuit. As illustrated in FIG. 2A, the buck-boost converter includes a capacitor C, a switching circuit S, an inductor L, and a diode D. The output of the rectifying and smoothing circuit 3 is connected to one end of the switching circuit S. The other end of the switching circuit S is connected to the cathode of the diode D. The anode of the diode D is connected to the load. The inductor L is connected in parallel to the switching circuit S between the switching circuit S and the diode D. The capacitor C is connected in parallel to the diode D between the diode D and the load. The switching circuit S is driven by a pulse signal such as that illustrated in FIG. 2C The switching circuit S is in an ON state when the signal level of the pulse signal is high, and is in an OFF state when the signal level of the pulse signal is low. In FIG. 2C, the time that the signal level of the pulse signal is high is a switched-ON time $t_{on}$. Further, in FIG. 2C, the period at which the signal level becomes high is switching period $t_{sw}$. The duty ratio of the switching circuit S is determined by the switched-ON time $t_{on}$ and the switching period $t_{sw}$. Duty ratio is the ratio between the switched-ON time $t_{on}$ and the switching period $t_{sw}$. Depending on the duty ratio, the output voltage of the rectifying and smoothing circuit 3 is raised or lowered. An output voltage $v_{out}$ from the converter 4, which has been raised or lowered, is applied to the load.

The power measuring processing circuitry 5 measures the power generated by the vibration power generator 2. The power measuring processing circuitry 5 measures the power generated by the vibration power generator 2 based on an operation parameter for the pulse signal and an output voltage from the vibration power generator 2. The power measuring processing circuitry 5 includes a CPU, an ASIC, a FPGA, a DSP, or other digital signal processor. The power measuring processing circuitry 5 may also include memory such as DRAM or SRAM. The power measuring processing circuitry 5 may also include a plurality of digital signal processors and memories. Further, the power measuring processing circuitry 5 may be configured by a combination of multiplication circuitry and division circuitry configured to perform the calculations described below. A power measurement method based on an operation parameter for the pulse signal and the output voltage will be described in detail below. In the power measurement method of the present embodiment, it is not necessary to measure current, and so power consumption can be kept lower than in typical power measurement methods, namely methods in which power is found by measuring voltage and current and multiplying these together. A filter for removing noise (for example, a high-pass filter or a low-pass filter) may be provided at the input stage of the power measuring processing circuitry 5. Although the power measuring processing circuitry 5 is disposed at a stage after the rectifying and smoothing circuit 3 in FIG. 1, the power measuring processing circuitry 5 may be disposed at a stage before the rectifying and smoothing circuit 3.

The control circuitry 6 controls a switching operation parameter of the converter 4, for example the switched-ON time of the pulse signal driving the converter 4, using the power measured by the power measuring processing circuitry 5. The control circuitry 6 includes a CPU, an ASIC, a FPGA, a DSP, or other digital signal processor. The control circuitry 6 may also include memory such as DRAM or SRAM. The control circuitry 6 may also include a plurality of digital signal processors and memories. Further, the control circuitry 6 may include the power measuring processing circuitry 5. The switching operation parameter controlled by the control circuitry 6 may be a parameter other than the switched-ON time, and may be the switching period or duty ratio. In the following, description will be given in which the switching operation parameter is the switched-ON time. Details regarding the operation of the control circuitry 6 will be described below.

The signal generation circuit 7 generates a pulse signal with a switched-ON time designated by the control circuitry 6, and outputs this pulse signal to the converter 4.

It should be noted that, as illustrated by the solid line in FIG. 1, the power measuring processing circuitry 5, the control circuitry 6, and the signal generation circuit 7 may operate using voltage output from the rectifying and smoothing circuit 3. In such case, the circuits in the power generation system 1 operate using power that has been generated by the vibration power generator 2. Thus, it is not necessary to provide another power source such as a battery to the power generation system 1. In practice, when the power generated by the vibration power generator 2 is transitory, the voltage supplied to the power measuring processing circuitry 5, the control circuitry 6, and the signal generation circuit 7 is also unstable. In order to guarantee the stability of the power generation system 1, it is desirable for the smoothing circuit of the rectifying and smoothing circuit 3 to have a certain level of capacitance.

Next, the power measurement method of the present embodiment will be described. In a system in which the rectifying and smoothing circuit 3 and the converter 4 illustrated in FIG. 2A are connected to the vibration power generator 2, when ripple in the output voltage $v_{rect}$ from the rectifying circuit 3A is considered to be sufficiently small, the output voltage $v_{rect}$ from the rectifying circuit 3A and the output $v_{s1}$ from the smoothing circuit 3E are both equal to the peak value of the output voltage $v_{vpg}$ from the vibration power generator 2. Accordingly, when the root mean square value of $v_{vpg}$ is defined as $v_{vpg\_rms}$, $v_{s1}$ is expressed as in Equation (1).

$$v_{s1} = \sqrt{2} v_{vpg\_rms} \quad \text{(Equation 1)}$$

It should be noted that when the resistance of the circuit as seen from the input of the converter 4 is defined as $r_{dc}$, the mean square value of the output current from the vibration power generator 2 is defined as $i_{vpg\_rms}$, and there is assumed to be no loss in the converter 4, a power balance equation is given as in Equation (2).

$$v_{vpg\_rms} i_{vpg\_rms} = \frac{v_{s1}^2}{r_{dc}} \quad \text{(Equation 2)}$$

When Equation (1) is substituted into Equation (2), Equation (3) is obtained.

$$v_{vpg\_rms} i_{vpg\_rms} = \frac{2 v_{vpg\_rms}^2}{r_{dc}} \quad \text{(Equation 3)}$$

Accordingly, the resistance $r_{dc}$ of the circuit as seen from the input of the converter 4 is expressed as in Equation (4).

$$r_{dc} = \frac{2 v_{vpg\_rms}}{i_{vpg\_rms}} \quad \text{(Equation 4)}$$

Here, the equivalent resistance $r_{eq}$ of the circuit as seen from the vibration power generator 2 is expressed as in Equation (5).

$$r_{eq} = \frac{v_{vpg\_rms}}{i_{vpg\_rms}} \quad \text{(Equation 5)}$$

Substituting Equation (5) into Equation (4) and moving $r_{eq}$ to one side of the equation gives Equation (6).

$$r_{eq} = \frac{r_{dc}}{2} \quad \text{(Equation 6)}$$

In cases in which the converter 4 is operated in discontinuous conduction mode (DCM), the input current iu of converter 4 rises in intervals in which the switching circuit S is switched ON, and is zero in intervals in which the switching circuit 5 is switched OFF. When the average input current of the converter 4 is defined as $i_{in\_avg}$, $i_{in\_avg}$ is expressed as in Equation (7).

$$i_{in\_avg} = \frac{1}{t_{sw}} \int_0^{t_{on}} \frac{v_{s1}}{l_{dc}} t\, dt = \frac{v_{s1} t_{on}^2}{l_{dc}} \quad \text{(Equation 7)}$$

Here, $t_{sw}$ is the switching period, and $t_{on}$ is the switched-ON time. Further, $l_{dc}$ is the inductance of the inductor L.

The resistance $r_{dc}$ of the circuit as seen from the input of the converter 4 is expressed as in Equation (8).

$$r_{dc} = \frac{v_{s1}}{i_{in\_avg}} \quad \text{(Equation 8)}$$

Substituting Equation (8) into Equation (7) gives Equation (9).

$$r_{dc} = \frac{2 t_{sw} l_{dc}}{t_{on}^2} \quad \text{(Equation 9)}$$

Further, when Equation (9) is substituted into Equation (6), the equivalent resistance $r_{eq}$ of the circuit as seen from the vibration power generator is expressed as in Equation (10).

$$r_{eq} = \frac{t_{sw}}{t_{on}^2} l_{dc} \quad \text{(Equation 10)}$$

Generally, inductance $l_{dc}$ is a fixed value that is determined during design. Thus, the equivalent resistance $r_{eq}$ able to be controlled by controlling the switching period $t_{sw}$ or the switched-ON time $t_{on}$. For example, if the switching period $t_{sw}$ is uniquely specified, the equivalent resistance $r_{eq}$ can be controlled by controlling only the switched-ON time $t_{on}$.

When the equivalent resistance of the circuit is $r_{eq}$, the power generated p by the vibration power generator 2 is expressed as in Equation (11).

$$p = \frac{v_{vpg}^2}{r_{eq}} \quad \text{(Equation 11)}$$

Here, $v_{vpg}$ is the root mean square value of the output voltage of the vibration power generator 2. When Equation (11) is substituted into Equation (10), Equation (12) below is obtained $$p = \frac{1}{t_{sw}l_{dc}} v_{vpg}^2 t_{on}^2 \quad \text{(Equation 12)}$$

As is clear from Equation (12), if the switching period $t_{sw}$ is uniquely specified, the power generated p by the vibration power generator 2 can be calculated from the output voltage $v_{vpg}$ from the vibration power generator 2 and the switched-ON time $t_{on}$. In such case, a current measurement is not needed to measure the power generated p. Note that in Equation (12), power generated p is calculated using the output voltage $v_{vpg}$ from the vibration power generator 2. In contrast, as illustrated in FIG. 1, when the power measuring processing circuitry 5 is disposed at a stage after the rectifying and smoothing circuit 3, the smoothed voltage $v_{s1}$ output from the rectifying and smoothing circuit 3 replaces output voltage $v_{vpg}$ in Equation (12).

Figure 3:
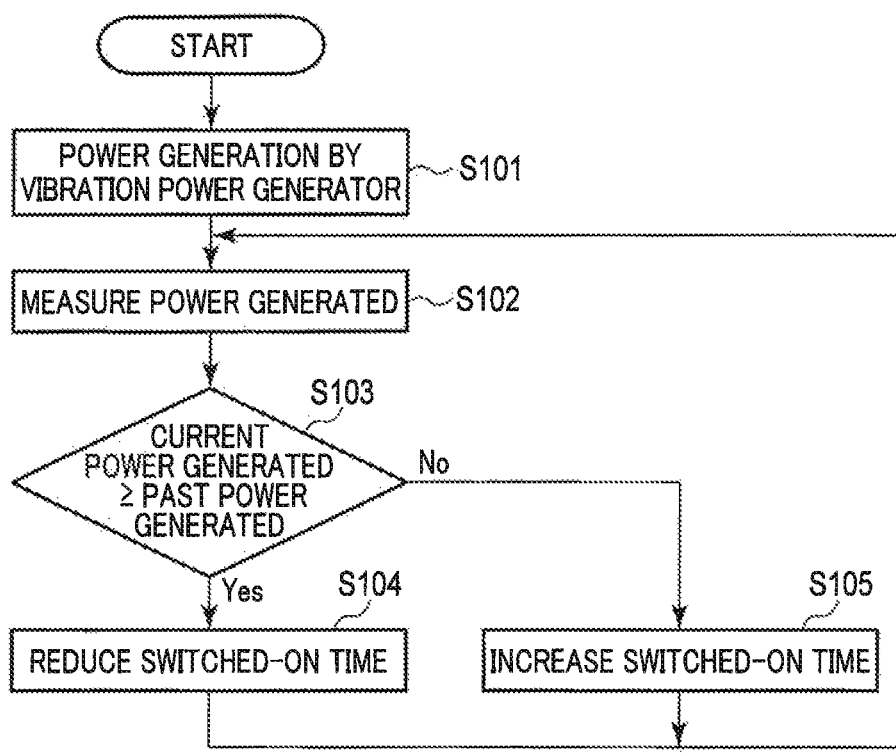
FIG. 3 is a flowchart illustrating an operating, procedure for the power generation system according to the first embodiment.

Next, the operation of the power generation system 1 of the first embodiment will be described. In the present embodiment, a case will be described in which a maximum power point tracking control algorithm is implemented using a general hill-climbing method. FIG. 3 is a flowchart illustrating an operating procedure for the power generation system 1 for the first embodiment. At step S101 in FIG. 3, the vibration power generator 2 receives ambient vibrations to generate power. Note that the switched-ON time $t_{on}$ at the start of power generation may be set to a time such that the equivalent resistance $r_{eq}$ as seen from the rectifying and smoothing circuit 3 is an optimum resistance $r_r$. The optimum resistance $r_r$ is a value for equivalent resistance that maximizes the power generated by the vibration power generator 2. In particular, when the frequency of ambient vibrations matches the natural vibration frequency of the vibration power generator 2 and the oscillatory waveform of ambient vibrations is sinusoidal, optimum resistance $r_r$ is expressed by Equation (13). Here, $k_v$, $c_m$, $r_c$, $l_c$, and $\omega_n$ in Equation (13) respectively represent the voltage constant of the vibration power generator 2, the mechanical damping coefficient of the vibration power generator 2, the resistance of a coil used for power generation in the vibration power generator 2, the inductance of the coil used for power generation, and the natural vibration frequency of the vibration power generator 2.

$$r_r = \frac{\sqrt{k_v^4 + 2c_m r_c k_v^2 + c_m^2(r_c^2 + \omega_n^2 l_c^2)}}{c_m} \quad \text{(Equation 13)}$$

In cases in which the frequency of ambient vibrations does not match the natural vibration frequency or the ambient vibrations are transitory, the optimum resistance $r_r$ cannot be expressed by Equation (13). Nevertheless, the switched-ON time $t_{on}$ at the start of power generation may be set to a time such that the equivalent resistance $r_{eq}$ as seen from the rectifying and smoothing circuit 3 is the optimum resistance $r_r$ indicated in Equation (13). This is because the switched-ON time $t_{on}$ is adjusted such that the power generated by the vibration power generator 2 is maximized by the maximum power point tracking control described below even if the frequency of ambient vibrations does not match the natural vibration frequency or the ambient vibrations are transitory.

At step S102, the power measuring processing circuitry 5 measures the power generated by the vibration power generator 2. The power measuring processing circuitry 5 takes in the smoothed voltage $v_{s1}$ output from the rectifying and smoothing circuit 3 and acquires the switched-ON time $t_{on}$ set by the control circuitry 6. Using the inputted output voltage and switched-ON time, the power measuring processing circuitry 5 calculates the power generated from Equation (12) described above. Then, the power measuring processing circuitry 5 inputs the calculated power generated to the control circuitry 6. The control circuitry 6 samples the calculated power generated at a certain time interval.

At step S103, the control circuitry 6 compares the current power generated $p_c$ with a past power generated $p_p$, and determines whether or not the current power generated $p_c$ is greater than or equal to the past power generated $p_p$. When the current power generated $p_c$ is greater than or equal to the past power generated $p_p$ at step S103, processing transitions to step S104. When the current power generated $p_c$, is not greater than or equal to the past power generated $p_p$ at step S103, processing transitions to step S105.

At step S104, the control circuitry 6 sets the signal generation circuit 7 with a switched-ON time $t_{on}$ that has been shortened by a prescribed small amount time. As indicated by Equation (11), shortening the switched-ON time $t_{on}$ causes the equivalent resistance $r_{eq}$ of the circuit to rise. At step S106, the control circuitry 6 sets the signal generation circuit 7 with a switched-ON time $t_{on}$ that has been lengthened by a prescribed small amount of time. As indicated by Equation (11), lengthening the switched-ON time $t_{on}$ causes the equivalent resistance $r_{eq}$ of the circuit to fall. Changing the equivalent resistance $r_{eq}$ changes the operating point of the vibration power generator 2. After step S104 or step 6105, processing returns to step S102. In an opposite manner to in step S104 and step S105, the control circuitry 6 may lengthen the switched-ON time $t_{on}$ when the current power generated $p_c$ is greater than or equal to the past power generated $p_p$ or may shorten the switched-ON time $t_{on}$ when the current power generated $p_c$ is not greater than or equal to the past power generated $p_p$.

Figure 4A:
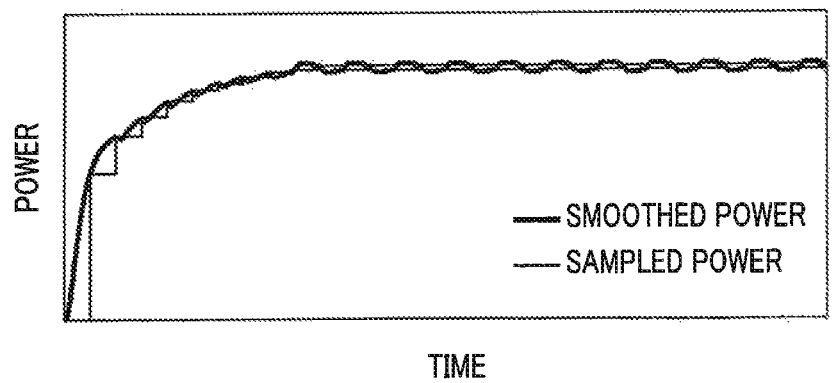
FIG. 4A is a graph of smoothed power measured based on a smoothed voltage from the vibration power generator of the first embodiment, and of sampled power sampled from the smoothed power at a certain time interval.
Figure 4B:
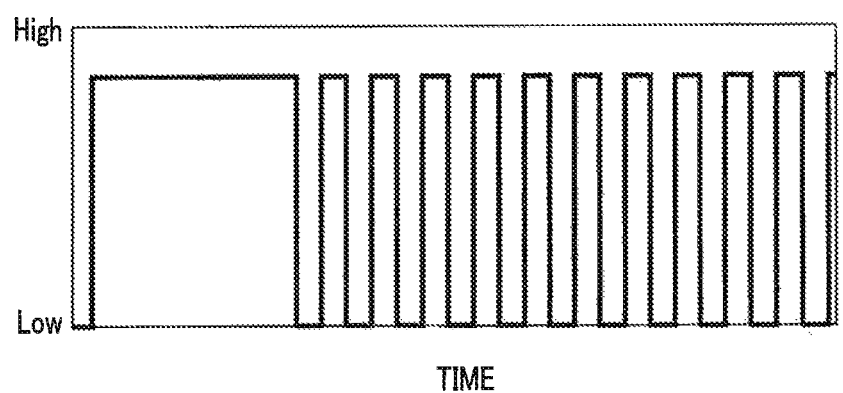
FIG. 4B is a diagram illustrating results of comparisons between the smoothed power and the sampled power in FIG. 4A at a certain time interval.
Figure 4C:
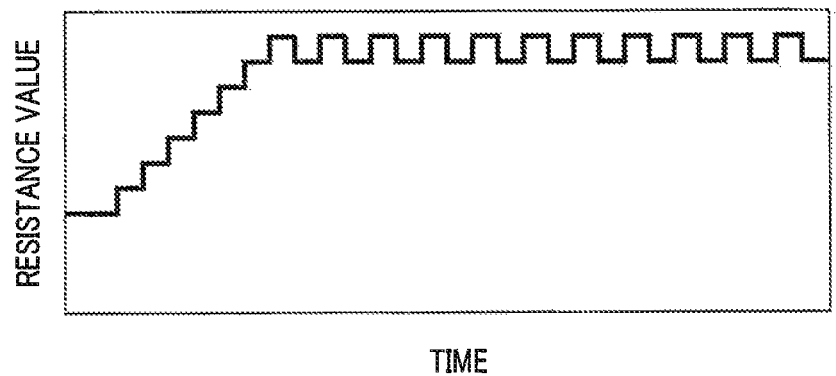
FIG. 4C is a diagram illustrating how the equivalent resistance of a circuit is changed based on the results of comparisons in FIG. 4B.

FIG. 4A, FIG. 4B, and FIG. 4C are diagrams illustrating, for the first embodiment, an example of operation of the power generation system 1 in cases in which ambient vibrations are steady vibrations (for example, sinusoidal vibrations). FIG. 4A is a graph illustrating smoothed power measured based on a smoothed voltage from the vibration power generator 2, and of sampled power sampled from the smoothed power at a certain time interval. FIG. 4B is a diagram illustrating results of comparisons between the smoothed power and the sampled power in FIG. 4A at a certain time interval; In FIG. 4B, high expresses a state in which the smoothed power is greater than the sampled power, and low expresses a state in which the smoothed power is less than the sampled power. It is preferable for there to be a phase delay between the timing at which the smoothed power is sampled and the timing at which the smoothed power and the sampled power are compared. In this case, the smoothed power in FIG. 4A corresponds to the current power generated $p_c$ of step S103, and the sampled power in FIG. 4A corresponds to the past power generated p of step S103. FIG. 4C is a diagram illustrating how the equivalent resistance $r_{eq}$ of the circuit is changed based on the results of comparisons in FIG. 4B. That is, the switched-ON time $t_{on}$ is set such that the equivalent resistance $r_{eq}$ rises when FIG. 4B is high, and the switched-ON time $t_{on}$ is set such that the equivalent resistance $r_{eq}$ is reduced when FIG. 4B is low. By having the equivalent resistance $r_{eq}$ change in the manner depicted in FIG. 4C, the power generated rises gradually and eventually converges at some maximum power point as illustrated in FIG. 4A.

In the power generation system 1 according to the first embodiment as described above, a buck-boost converter is used as an example of the converter 4. In cases in which a buck-boost converter is used, the equivalent resistance $r_{eq}$ of the circuit as seen from the power generator is expressed by Equation 11) without regard to the load connected to the output. By using such an equivalent resistance $r_{eq}$, it is unnecessary to measure current when measuring power for maximum power point tracking control using a hill-climbing method, for example. In this manner, in the power generation system 1 according to the first embodiment, by having current measurements be unnecessary, maximum power point tracking control can be performed with low power consumption. This is particularly effective when the amount of power generated by the power generator is low, such as in cases in which a vibration power generator is used.

It should be noted that in the first embodiment the actual power generated is measured according to Equation. (12). However, instead of the power generated measured according to Equation (12), the product of the switched-ON time $t_{on}$ and the output voltage $v_{vpq}$ of the vibration power generator 2 may be used as an reference for power comparisons during maximum power point tracking control using a hill-climbing method.

First Modified Example of the First Embodiment

Figure 5:
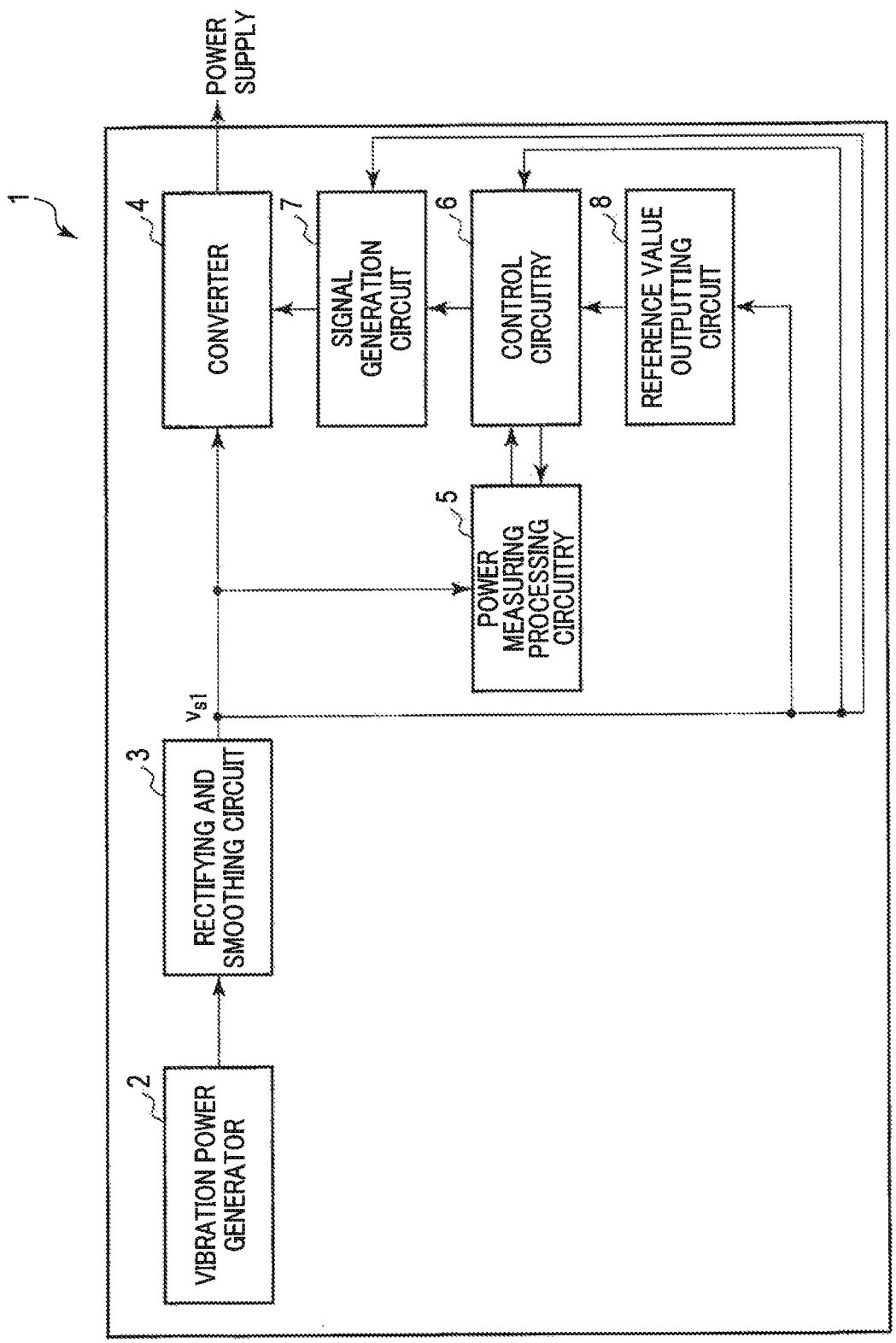
FIG. 5 is a block diagram illustrating a power generation system according to a first modified example of the first embodiment.

FIG. 5 is a block diagram illustrating a power generation system 1 according to a first modified example of the first embodiment. As illustrated in FIG. 5, in addition to a vibration power generator 2, a rectifying and smoothing circuit 3, a converter 4, power measuring processing circuitry 5, control circuitry 6, and a signal generation circuit 7, the power generation system 1 comprises a reference value outputting circuit 8. The reference value outputting circuit 8 includes memory such as DRAM or SRAM. Note that the reference value outputting circuit 8 may be provided to a power generation system according to any of the embodiments described below.

The reference value outputting circuit 8 stores a lower threshold for switched-ON time, or in other words, stores an upper threshold for equivalent resistance. The control circuitry 6 changes the switched-ON time, or in other words, changes the equivalent resistance, so as not to exceed the upper threshold for equivalent resistance output from the reference value outputting circuit 8. The upper threshold for equivalent resistance can be set based on, for example, Equation (13). The upper threshold for equivalent resistance is, for example, set to a value obtained by adding a fixed tolerance value to the equivalent resistance expressed by Equation (13), or to a fixed multiple of the equivalent resistance expressed by Equation (13). In cases in which the power generation system uses a vibration power generator 2, in contrast to a power generation system using a solar cell, the equivalent resistance $r_{eq}$ corresponding to the maximum power point is expressed by Equation (13), and the equivalent resistance is often lower than the equivalent resistance when the frequency of ambient vibrations matches the natural vibration frequency of the vibration power generator 2 and the oscillatory waveform of ambient vibrations is sinusoidal. Thus, in a power generation systems using a vibration power generator 2, the equivalent resistance expressed by Equation (13) has the potential to be an effective upper threshold.

In a modified example of the first embodiment such as described above, by setting an upper threshold for equivalent resistance, control can be prevented from diverging. As a result, the stability of the power generation system 1 is improved. Further, by setting an upper threshold for equivalent resistance based on the equivalent resistance expressed by Equation (13), the possibility that the equivalent resistance will reach an optimum value at an early stage can be increased.

It should be noted that the reference value outputting circuit 8 may also store an upper threshold for switched-ON time, or in other words, store a lower threshold for equivalent resistance. In such case, the control circuitry 6 changes the switched-ON time, or in other words, changes the equivalent resistance, within the range of the threshold for equivalent resistance output from the reference value outputting circuit 8.

Second Modified Example of the First Embodiment

FIG. 6 is a block diagram illustrating a power generation system 1 according to a second modified example of the first embodiment. As illustrated in FIG. 6, in addition to a vibration power generator 2, a rectifying and smoothing circuit 3, a converter 4, power measuring processing circuitry 5, control circuitry 6, and a signal generation circuit 7, the power generation system 1 comprises a rectifying and smoothing circuit 9.

Figure 7:
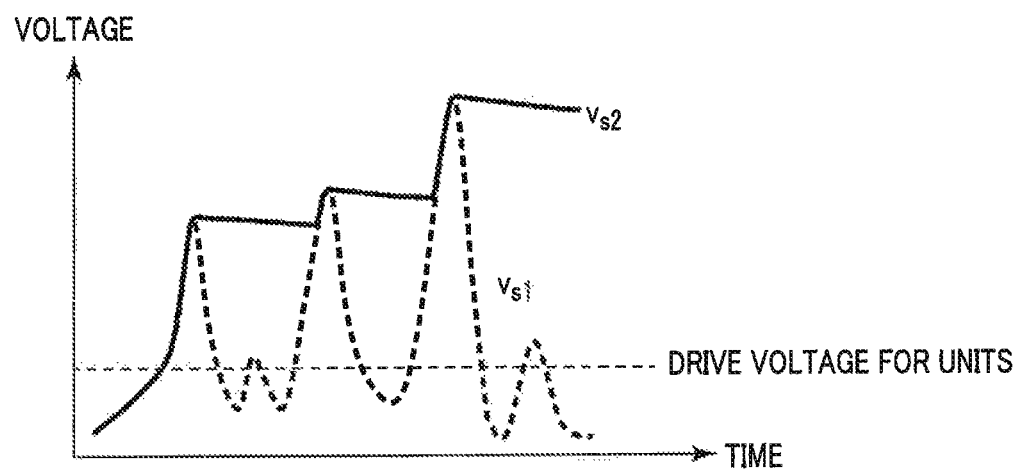
FIG. 7 is a diagram comparatively illustrating a smoothed voltage $v_{s1}$ output from a rectifying and smoothing circuit 3 and a smoothed voltage $v_{s2}$ output from a rectifying and smoothing circuit 9.

The rectifying and smoothing circuit 9, which serves as a second rectifying and smoothing circuit, is disposed so as to isolate the power supply system for the control circuitry 6 from the power supply system for each circuit in the power generation system 1, namely the power measuring processing circuitry 5, the control circuitry 6, and the signal generation circuit 7. The rectifying and smoothing circuit 9 further rectifies and smooths the Smoothed voltage $v_{s1}$ output from the rectifying and smoothing circuit 3. FIG. 7 is a diagram comparatively illustrating a smoothed voltage $v_{s1}$ output from a rectifying and smoothing circuit 3 and a smoothed voltage $v_{s2}$ output from a rectifying and smoothing circuit 9. As illustrated in FIG. 7, the smoothed voltage $v_{s2}$ output from the rectifying and smoothing circuit 9 is a voltage that is an envelope of the smoothed voltage $v_{s1}$ output from the rectifying and smoothing circuit 3.

In cases in which the ambient vibrations are transitory, it is possible that the smoothed voltage $v_{s1}$ smoothed by the rectifying and smoothing circuit 3 will momentarily drop below the drive voltage for the circuits in the power generation system 1, namely the power measuring processing circuitry 5, the control circuitry 6, and the signal generation circuit 7, as illustrated by the dashed line in FIG. 7. Consequently, the operation of these circuits may not be stable. However, by using power (second DC power) that has been further rectified and smoothed by the rectifying and smoothing circuit 9, the supply of power to these circuits is made stable. As a result, the stability of the power generation system 1 is improved.

It should be noted that in order to guarantee the stability of the power generation system 1 with the configuration of FIG. 1, it is desirable for the smoothing circuit of the rectifying and smoothing circuit 3 have a certain level of capacitance. However, with the configuration of FIG. 9, by providing the rectifying and smoothing circuit 9 separately to the powersupply system, the capacitance of the smoothing circuit of the rectifying and smoothing circuit 3 can be reduced. Capacitive components restrict the movement of moving parts in the vibration power generator 2, and by extension, cause a drop in the generated power. Therefore, it is good to reduce the capacitance of the power supply system. With the configuration of FIG. 6, since a capacitive component of the power supply system can be reduced, power generation can be increased as much as possible.

As described above, by disposing the rectifying and smoothing circuit 9 in the power generation system 1 according to the second modified example of the first embodiment, even when the capacitance of the rectifying and smoothing circuit 3 is reduced, system stability is high. Further, by reducing the capacitance of the rectifying and smoothing circuit 3, the movement of moving parts in the vibration power generator 2 is not suppressed, and the power generated can be increased as much as possible.

It should be noted that the rectifying and smoothing circuit 9 may be provided to a power generation system 1 according to the second embodiment described below.

Second Embodiment

In a second embodiment, a maximum power point tracking control algorithm that differs from the hill-climbing method will be described. The configuration for a power generation system 1 according to the second embodiment is identical to the configuration in FIG. 1, FIG. 5, or FIG. 6. Accordingly, description thereof will be omitted.

A power approximation equation expressing power p with respect to the equivalent resistance $r_{eq}$ of the circuit as seen from the vibration power generator 2 can be expressed as in Equation (14). Here, $r_c$ is the resistance of the power generation coil, which is already known. a, b, and c are coefficients that are unknown.

$$p = \frac{r_{eq}}{a + b(r_c + r_{eq}) + c(r_c + r_{eq})^2} \quad \text{(Equation 14)}$$

Figure 8:
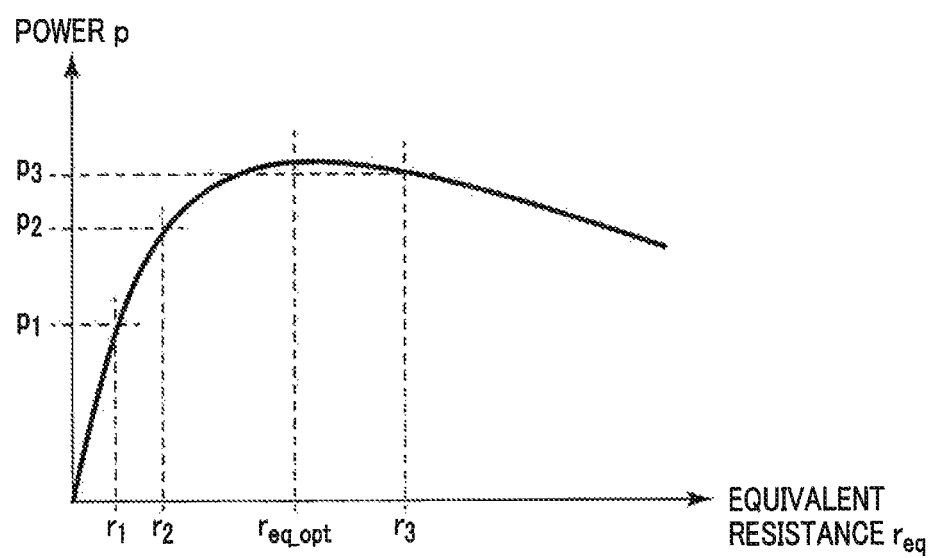
FIG. 8 is a graph of power with respect to equivalent resistance.

FIG. 8 is a graph of power p with respect to equivalent resistance $r_{eq}$. The graph in FIG. 8 is approximated using the curve expressed by Equation (14). Because of this, the values of the three unknown coefficients a, b, and c in Equation (14) can be found by solving a system of equations for powers $p_1$, $p_2$, and $p_3$ with respect to three equivalent resistances $r_1$, $r_2$, and $r_3$. Further, when the optimum resistance at which power is maximized is defined as $r_{eq\_opt}$, optimum resistance $r_{eq\_opt}$ expressed as in Equation (15). That is, the optimum resistance $r_{eq\_opt}$ can be determined once the values of the unknown coefficients a, b, and c have been determined.

$$r_{eq\_opt} = \sqrt{\frac{a}{c} + \frac{b}{c} r_c + r_c^2} \quad \text{(Equation 15)}$$

Figure 9:
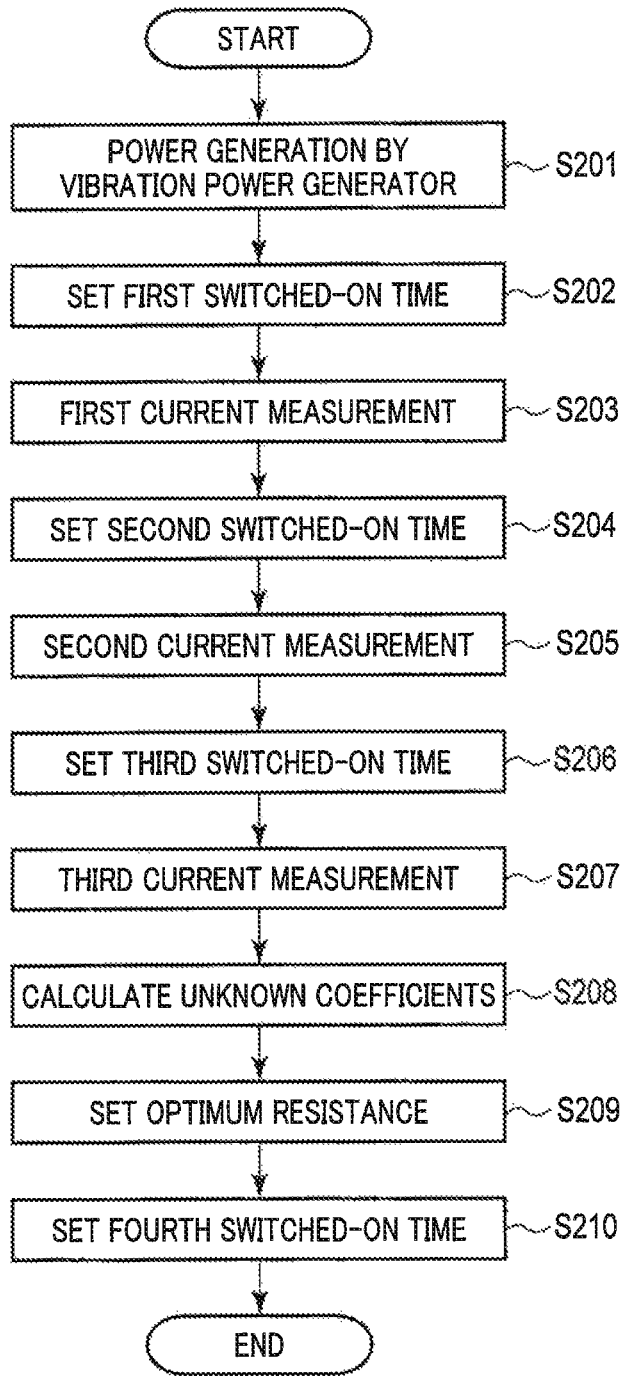
FIG. 9 is a flowchart illustrating an operating procedure for a power generation system according to a second embodiment.

Next, the operation of the power generation system 1 of the second embodiment will be described. FIG. 9 illustrates an operating procedure for the power generation system 1 of the second embodiment. At step S201 in FIG. 9, the vibration power generator 2 receives ambient vibrations and generates power.

At step S202, the control circuitry 6 sets switched-ON time $t_{on1}$. At this point, the switched-ON time $t_{on1}$ may be freely selected. At step S203, the power measuring processing circuitry 5 measures a power generated pa by the vibration power generator 2 with respect to an equivalent resistance $r_1$ corresponding to the switched-ON time $t_{on1}$. The power generated pa is calculated based on Equation (12) described above. Then, the power measuring processing circuitry 5 inputs the measured power generated $p_1$ to the control circuitry 6.

At step S204, the control circuitry 6 sets a switched-ON time $t_{on2}$. The switched-ON time $t_{on2}$ may differ from the switched-ON time $t_{on1}$. At step S205, the power measuring processing circuitry 5 measures a power generated $p_2$ by the vibration power generator 2 with respect to an equivalent resistance $r_2$ corresponding to the switched-ON time $t_{on2}$. Then, the power measuring processing circuitry 5 inputs the measured power generated $p_2$ to the control circuitry 6.

At step S206, the control circuitry 6 sets a switched-ON time $t_{on3}$. The switched-ON time $t_{on3}$ may differ from the switched-ON time $t_{on1}$ and the switched-ON time $t_{on2}$. At step S207, the power measuring processing circuitry 5 measures a power generated $p_3$ by the vibration power generator 2 with respect to an equivalent resistance $r_3$ corresponding to the switched-ON time $t_{on3}$. Then, the power measuring processing circuitry 5 inputs the measured power generated $p_3$ to the control circuitry 6.

At step S208, to calculate the values of the three unknown coefficients a, b, and c described above, the control circuitry 6 solves the system of equations obtained by substituting the powers generated $p_1$, $p_2$, and $p_3$ and the equivalent resistances $r_1$, $r_2$, and $r_3$ respectively calculated from the switched-ON times $t_{on1}$, $t_{on2}$, and $t_{on3}$ into Equation (14). At step S209, the control circuitry 6 calculates the optimum resistance $r_{eq\_opt}$ from Equation (15) using the calculated values for the unknown coefficients a, b, and c. Then, at step S210, the control circuitry 6 calculates a switched-ON time $t_{on}$ corresponding to the optimum resistance $r_{eq\_opt}$ based on Equation (11), and sets the signal generation circuit 7 with the calculated switched-ON time $t_{on}$.

FIG. 10A and FIG. 10B are diagrams illustrating, for the second embodiment, an example of operation of the power generation system 1 in cases in which the ambient vibrations are steady vibrations (for example, sinusoidal vibrations). FIG. 10A is a graph illustrating smoothed power measured based on a smoothed voltage from the vibration power generator 2, and of sampled powers sampled from the smoothed power at a certain time interval. The timings for the power measurements of steps S203, S205, and S207 of FIG. 9 are illustrated in FIG. 10A. FIG. 10B is a graph illustrating changes in the equivalent resistance of a circuit over time; and The timings for setting the switched-ON time of steps S202, S204, S206, and S210 of FIG. 9 are illustrated in FIG. 10B. As illustrated in FIG. 10B, after setting the switched-ON time three times, in other words, after setting equivalent resistance three times, at a timing for step S210, the equivalent resistance is finally adjusted to the optimum resistance. Note that it is preferable that the timings at which the smoothed power is sampled are not timings immediately after changing the switched-ON time, but are timings at least some time constant, or a multiple of this time constant, after changing the switched-ON time. This is because in cases in which the power generation system uses a vibration power generator 2, due to influence from ambient vibrations, the circuit is unstable immediately after changing the switched-ON time.

The control circuitry 6 may include refresh functionality that returns the value of the switched-ON time, in other words, the value of the equivalent resistance, to its original value after a fixed amount of time has passed since the start of power generation. This refresh functionality enables maximum power point tracking control to be reattempted when by some chance the switched-ON time converges on an unexpected value. Note that the control circuitry 6 of the first embodiment may also include such refresh functionality.

Although the approximation equation, Equation (14), in the second embodiment is a second-order approximation equation, a higher-order approximation equation may be used. By using a higher-order approximation equation, the precision of calculations for optimum resistance is increased, but since the number of unknowns increases, the number of measurements rises.

In the second embodiment as described above, the switched-ON time $t_{on}$ is changed three times to change the equivalent resistance $r_{eq}$, powers $p_1$, $p_2$, and $p_3$ are measured at the equivalent resistances $r_1$, $r_2$, and $r_3$, the values of three unknown coefficients a, b, and c are determined by solving a system of equations based on Equation (14), and from these coefficients, the optimum resistance is calculated based on Equation (15), whereby a switched-ON time corresponding to this optimum resistance is set. Thereby, the power and time required to determine the optimum resistance can be reduced compared to the first embodiment.

First Modified Example of the Second Embodiment

In a first modified example of the second embodiment, a maximum power point tracking control algorithm will be described that further simplifies the maximum power point tracking control algorithm described in the second embodiment.

In cases in which the resistance of the power generation coil of the vibration power generator 2 is small enough with respect to the equivalent resistance $r_{eq}$ of the circuit as seen from the vibration power generator 2 to be ignored, Equation (14) is expressed as in Equation (16).

$$p = \frac{r_{eq}}{a + br_{eq} + cr_{eq}^2} \quad \text{(Equation 16)}$$

Then, Equation (15), which expresses the optimum resistance $r_{eq\_opt}$, is expressed as in Equation (17).

$$r_{eq\_opt} = \sqrt{\frac{a}{c}} \quad \text{(Equation 17)}$$

In this manner, the equations for finding the optimum resistance $r_{eq\_opt}$ can be simplified in cases in which the resistance of the power generation coil of the vibration power generator 2 is sufficiently small. Thus, similarly to in the second embodiment, the switched-ON time $t_{on}$ is changed three times to change the equivalent resistance $r_{eq}$, powers $p_1$, $p_2$, and $p_3$ are measured at the equivalent resistances $r_1$, $r_2$, and $r_3$, the values of two unknown coefficients a and c are determined by solving system of equations based on Equation (14), and then from these unknown coefficients a and c, the optimum resistance $r_{eq\_opt}$ is calculated based on Equation (17), and a switched-ON time corresponding to this optimum resistance $r_{eq\_opt}$ is set, whereby power is able to be maximized.

Second Modified Example of the Second Embodiment

In a second modified example of the second embodiment, a maximum power point tracking control algorithm will be described that further simplifies the maximum power point tracking control algorithm described in the first modified example of the second embodiment.

Figure 11:
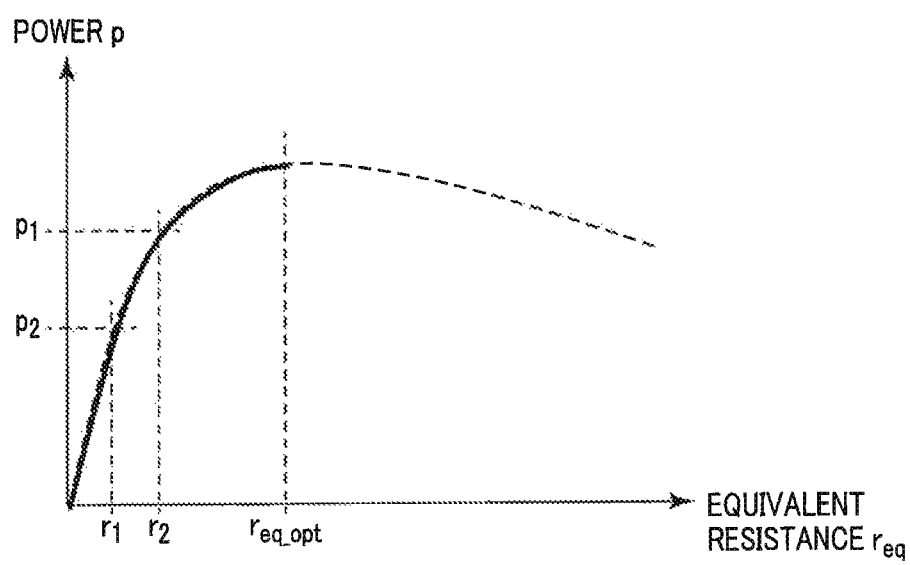
FIG. 11 is a diagram for explaining a second modified example of the second embodiment.

FIG. 11 is a diagram for explaining a second modified example of the second embodiment. FIG. 11 illustrates a graph of power with respect to equivalent resistance $r_{eq}$. A monotonically increasing section of this graph is indicated using a solid line. In this monotonically increasing section, with respect to equivalent resistance $r_{eg}$, power p is approximated as in Equation (18).

$$p = -ar_{eq} + br_{eq}^2 \quad \text{(Equation 18)}$$

Further, optimum resistance $r_{eq\_opt}$ is expressed as in Equation (19).

$$r_{eq\_opt} = \frac{a}{2b} \quad \text{(Equation 19)}$$

Thus, in the second modified example of the second embodiment, the switched-ON time $t_{on}$ is changed two times to change the equivalent resistance $r_{eq}$, powers $p_1$ and $p_2$ are measured at the equivalent resistances $r_1$ and $r_2$, the values of two unknown coefficients a and b are determined by solving a system of equations based on Equation (14), and then from these unknown coefficients a and b, the optimum resistance $r_{eq\_opt}$ is calculated based on Equation (19), and a switched-ON time corresponding to this optimum resistance $r_{eq\_opt}$ is set, whereby power is able to be maximized. That is, because it is sufficient to simply find the maximum power point, the optimum resistance can be found using an approximation equation expressing the monotonically increasing section. In this manner, the equations for finding the optimum resistance can be further simplified.

Third Embodiment

Figure 12:
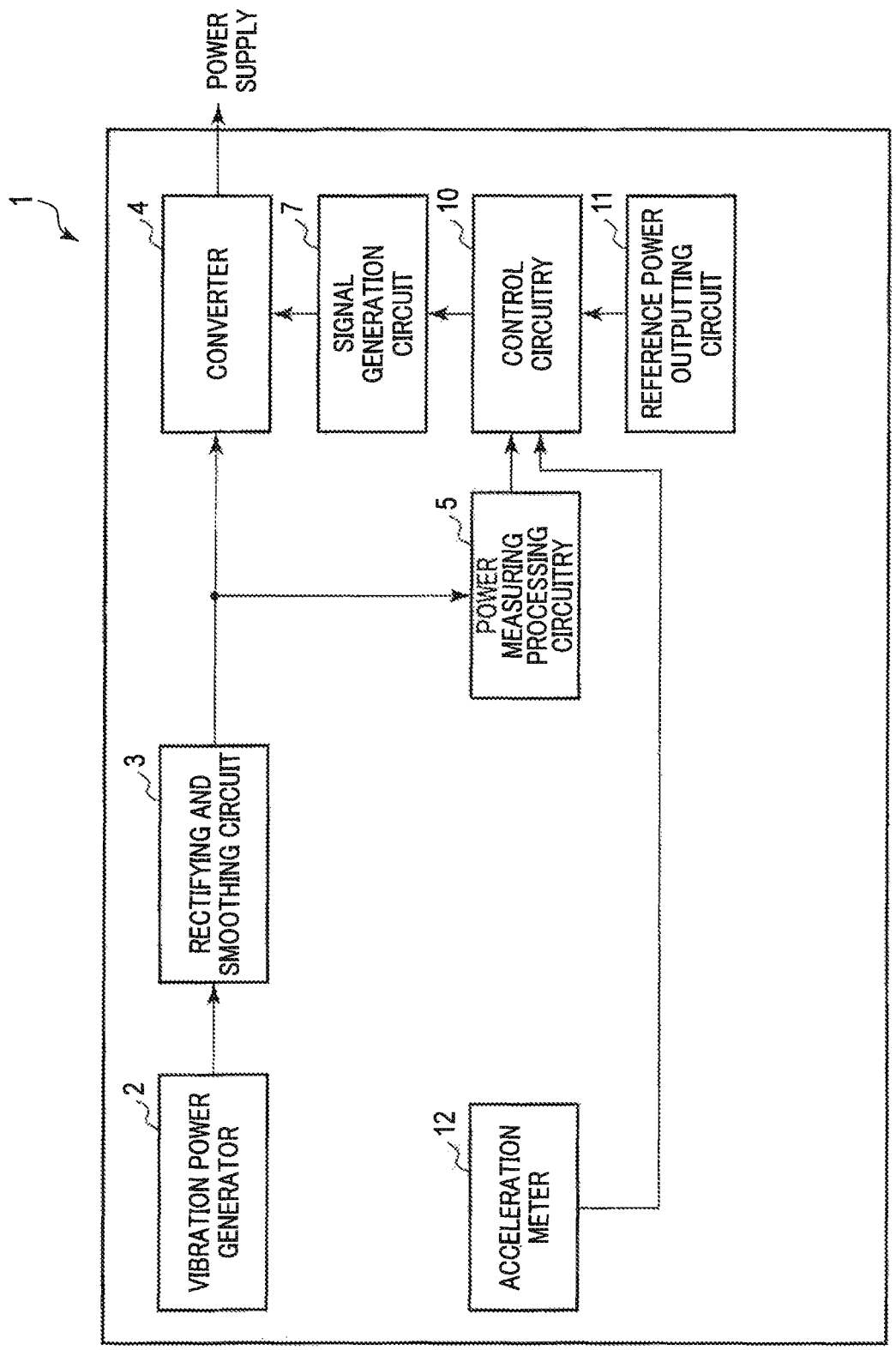
FIG. 12 is a block diagram illustrating a power generation system according to a third embodiment.

FIG. 12 is a block diagram illustrating a power generation system according to a third embodiment. As illustrated in FIG. 12, in addition to a vibration power generator 2, a rectifying and smoothing circuit 3, a converter 4, a power measuring processing circuitry 5, and a signal generation circuit 7, a power generation system 1 comprises control circuitry 10, a reference power outputting circuit 11, and an acceleration meter 12.

The control circuitry 10 controls a switching operation parameter of the converter 4, for example the switched-ON time of the pulse signal driving the converter 4, using the power measured by the power measuring processing circuitry 5. The control circuitry 10 controls conditions of a switching operation in accordance with an algorithm different from a maximum power point tracking control algorithm of a control circuit 6. The control circuitry 10 includes a digital signal processor such as a CPU, an ASIC, an FPGA, or a DSP. The control circuitry 10 may be configured to control conditions of a switching operation by an analogue circuit. The control circuitry 10 may also include memory such as DRAM or SRAM. The control circuitry 10 may also include a plurality of digital signal processors and memories. Further, the control circuitry 10 may include the power measuring processing circuitry 5. The switching operation parameter controlled by the control circuitry 10 may be a parameter other than the switched-ON time, and may be the switching period or duty ratio. In the following, description will be given in which the switching operation parameter is the switched-ON time. The operation of the control circuitry 10 will be described in detail later.

The reference power outputting circuit 11 includes memory such as DRAM or SRAM. The reference power outputting circuit 11 stores reference power. The reference power is, for example, an upper limit value which serves as a reference of control of the power. The reference power outputting circuit 11 may be configured to output a threshold as the reference power by the analogue circuit.

The acceleration meter 12 measures ambient acceleration applied to the vibration power generator 2 due to ambient vibrations. The ambient acceleration corresponds to acceleration of the ambient vibrations. Therefore, a waveform of the ambient vibrations may be measured from the ambient acceleration.

Next, the operation of the power generation system of the third embodiment will be described. FIG. 13 is a flowchart illustrating an operating procedure for a power generation system 1 according to a third embodiment. At step S301 in FIG. 13, the vibration power generator 2 receives ambient vibrations and generates power. Note that the switched-ON time $t_{on}$ at the start of power generation may be set to a time such that the equivalent resistance $r_{eq}$ as seen from the rectifying and smoothing circuit 3 is an optimum resistance $r_r$. The optimum resistance $r_r$ is a value for equivalent resistance that maximizes the power generated by the vibration power generator 2. When the frequency of ambient vibrations matches the natural vibration frequency of the vibration power generator 2 and the oscillatory waveform of ambient vibrations is sinusoidal, optimum resistance $r_r$ is expressed by Equation (13). In addition, the optimum resistance $r_r$ may be set to an optimum resistance $r_{r,random}$ when the oscillatory waveform of the ambient vibrations has a random waveform. The optimum resistance when the oscillatory waveform of the ambient vibrations has a random waveform is expressed by Equation (20).

$$r_{r,random} = \sqrt{r_c^2 + \frac{k_v^2 r_c}{c_m}} \qquad \text{(Equation 20)}$$

In order to determine which one of the optimum resistance when the oscillatory waveform of the ambient vibrations is sinusoidal and the optimum resistance when the oscillatory waveform of the ambient vibrations has a random waveform is to use, the control circuitry 10 may determine whether or not the oscillatory waveform of the ambient vibrations has a random waveform from ambient acceleration measured by using the acceleration meter 12. Alternatively, as another method of determining whether or not the oscillatory waveform of the ambient vibrations has a random waveform, the control circuitry 10 may calculate the oscillatory waveform of the ambient vibrations by applying a reverse characteristic filter of the vibration power generator 2 to an electric signal output from the vibration power generator 2.

At step S302, the power measuring processing circuitry 5 measures the power generated by the vibration power generator. The power measuring processing circuitry calculates power generated from the Equation (12) described above. Then, the power measuring processing circuitry 5 inputs the calculated power generated to the control circuitry 10. The control circuit 10 samples the calculated power generated at a certain time interval.

At step S303, the control circuitry 10 determines whether or not the current power generated $p_c$ is greater than reference power $p_{ref}$ stored in the reference power outputting circuit 11. The reference power $p_{ref}$ may be determined as Equation (21) from a relationship between the power generated and the displacement when the frequency of the ambient vibrations is the natural vibration frequency of the vibration power generator 2, the oscillatory waveform of the ambient vibrations is sinusoidal. Here, $x_{ref}$ is reference displacement, that is, threshold of displacement of a moving part to be restricted.

$$p_{ref} = \frac{ck_v^2 \omega_n^2 \sqrt{(k_v^2 + cr_c)^2 + c^2 l_c^2 \omega_n^2}}{2k_v^4 + 4ck_v^2 r_c + 4c} x_{ref}^2 \qquad \text{(Equation 21)}$$

$$\left( c(r_c^2 + l_c^2 \omega_n^2) + r_c \sqrt{(k_v^2 + cr_c)^2 + c^2 l_c^2 \omega_n^2} \right)$$

When the current power generated $p_c$ is determined to be greater than reference power $p_{ref}$ stored in the reference power outputting circuit 11 at step S303, processing transitions to step S304. At step S303, when the current power generated $p_c$ is determined not to be greater than the reference power $p_{ref}$ stored in the reference power outputting circuit 11, the procedure goes back to step S302.

At step S304, the control circuitry 10 increases the switched-ON time $t_{on}$. As described above, the equivalent resistance $r_{eq}$ falls as the switched-ON time $t_{on}$ increases, and current also rises. Accordingly, a damping force is increased, and the displacement of the moving part is decreased. After step S304, processing returns to step S302.

Figure 14A:
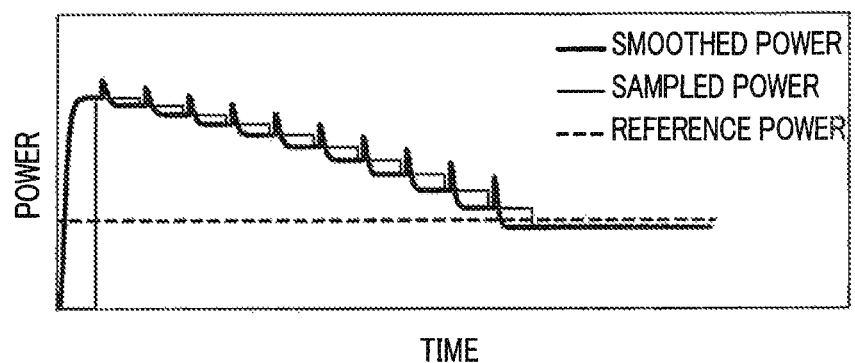
FIG. 14A is a graph illustrating a relationship among smoothed power obtained by smoothing power of a vibration power generator, sampling power sampled from the smoothed power at a certain time interval, and reference power.
Figure 14B:
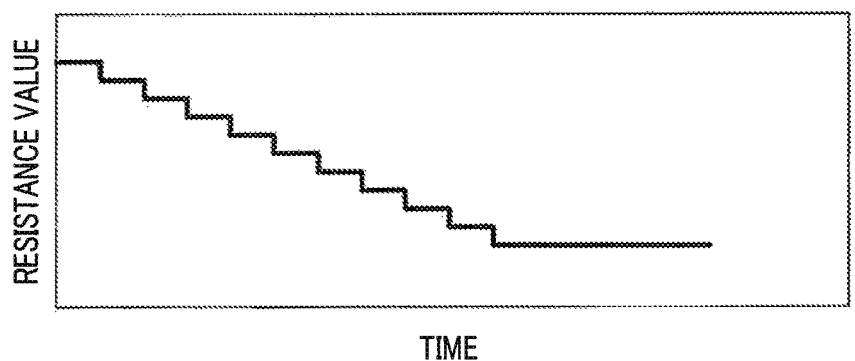
FIG. 14B is a graph illustrating changes in an equivalent resistance of a circuit in association with control in FIG. 14A over time.
Figure 14C:
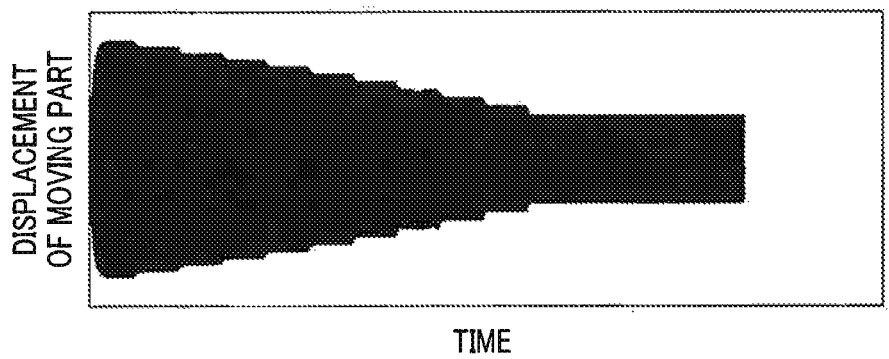
FIG. 14C is graph illustrating changes in a displacement of a moving part of a circuit in association with control in FIG. 14A over time.

Next, an example of the operation of the power generation system 1 when the ambient vibrations are stationary (for example, a sinusoidal wave). FIG. 14A is a graph illustrating a relationship among smoothed power obtained by smoothing power of the vibration power generator, sampling power sampled from the smoothed power at a certain time interval, and reference power. FIG. 14B is a graph illustrating changes in the equivalent resistance $r_{eq}$ of a circuit in association with control in FIG. 14A over time. FIG. 14C is a graph illustrating changes in the displacement of the moving part of a circuit in association with control in FIG. 14A over time. Here, the sampled power corresponds to current power $p_c$.

When the sampled power is greater than the reference power, the control circuitry 10 increases the switched-ON time $t_{on}$. Accordingly, as illustrated in FIG. 14B, the equivalent resistance $r_{eq}$ falls. In other words, as illustrated in FIG. 14A, the sampled power gradually falls as well. Finally, the sampled power converges near the reference power. Accordingly, by the fall of the equivalent resistance $r_{eq}$, displacement of the moving part is decreased as illustrated in FIG. 14C. Finally, the displacement of the moving part converges near a certain value. Note that it is preferable for there to be a phase delay between the timing at which the smoothed power is sampled and the timing at which the smoothed power and the sampled power are compared.

As described thus far, in the power generation system according to the third embodiment, displacement of the moving part is suppressed by controlling the power of the vibration power generator 2 to be equal to or lower than the preset power.

Here, as described in a first modified example of the first embodiment, an upper limit, a lower limit, or both of them may be set on the switched-ON time $t_{on}$ for preventing divergence of the power control.

In addition, as long as the current power generated $p_c$ is smaller than the reference power $p_{ref}$, the maximum power point tracking control described in the first embodiment or the second embodiment are employed in parallel so that the power measured by the power measuring processing circuitry 5 becomes the maximum.

Also, in the example illustrated in FIG. 13, an example in which the switched-ON time $t_{on}$ is increased when the current power generated $p_c$ is greater than the reference power $p_{ref}$. The power of the vibration power generator 2 may be controlled to a level equal to preset power or lower by switching the switched-ON time by a binary value instead of increasing the switched-ON time $t_{on}$.

In the third embodiment, measurement performed by the power measuring processing circuitry 5 is based on an output voltage $v_{vpg}$ and the switched-ON time $t_{on}$. In the third embodiment, the power measuring processing circuitry 5 may configured to calculate the power of the vibration power generator 2 by other power measurement methods, such as by measuring voltage and current and multiplying these values.

First Modified Example of the Third Embodiment

FIG. 15 illustrates a power generation system according to a first modified example of the third embodiment. As illustrated in FIG. 15, in addition to the vibration power generator 2, the rectifying and smoothing circuit 3, the converter 4, the power measuring processing circuitry 5, the signal generation circuit 7, the control circuitry 10, the reference power outputting circuit 11, and the acceleration meter 12, the power generation system comprises a power measuring processing circuitry 13.

The power measuring processing circuitry 13 includes a digital signal processor such as a CPU, an ASIC, an FPGA, or a DSP. The power measuring processing circuitry 13 may also include memory such as DRAM or SRAM. The power measuring processing circuitry 13 may also include a plurality of digital signal processors and memories. The power measuring processing circuitry 13 measures average power consumption consumed by a load. The power measuring processing circuitry 13 may calculates average power consumption by measuring voltage applied to the load and current flowing in the load, and multiplying these values. The power measuring processing circuitry 13 determines reference power storing in the reference power outputting circuit 11 according to the average power consumption consumed by the load. For example, the power measuring processing circuitry 13 may be determined by using a value obtained by multiplying the average power consumption by 1.5 as reference power.

In the first modified example of the third embodiment, even when the average power consumption of the load is unknown, the reference power is determined automatically.

Second Modified Example of Third Embodiment

Figure 16:
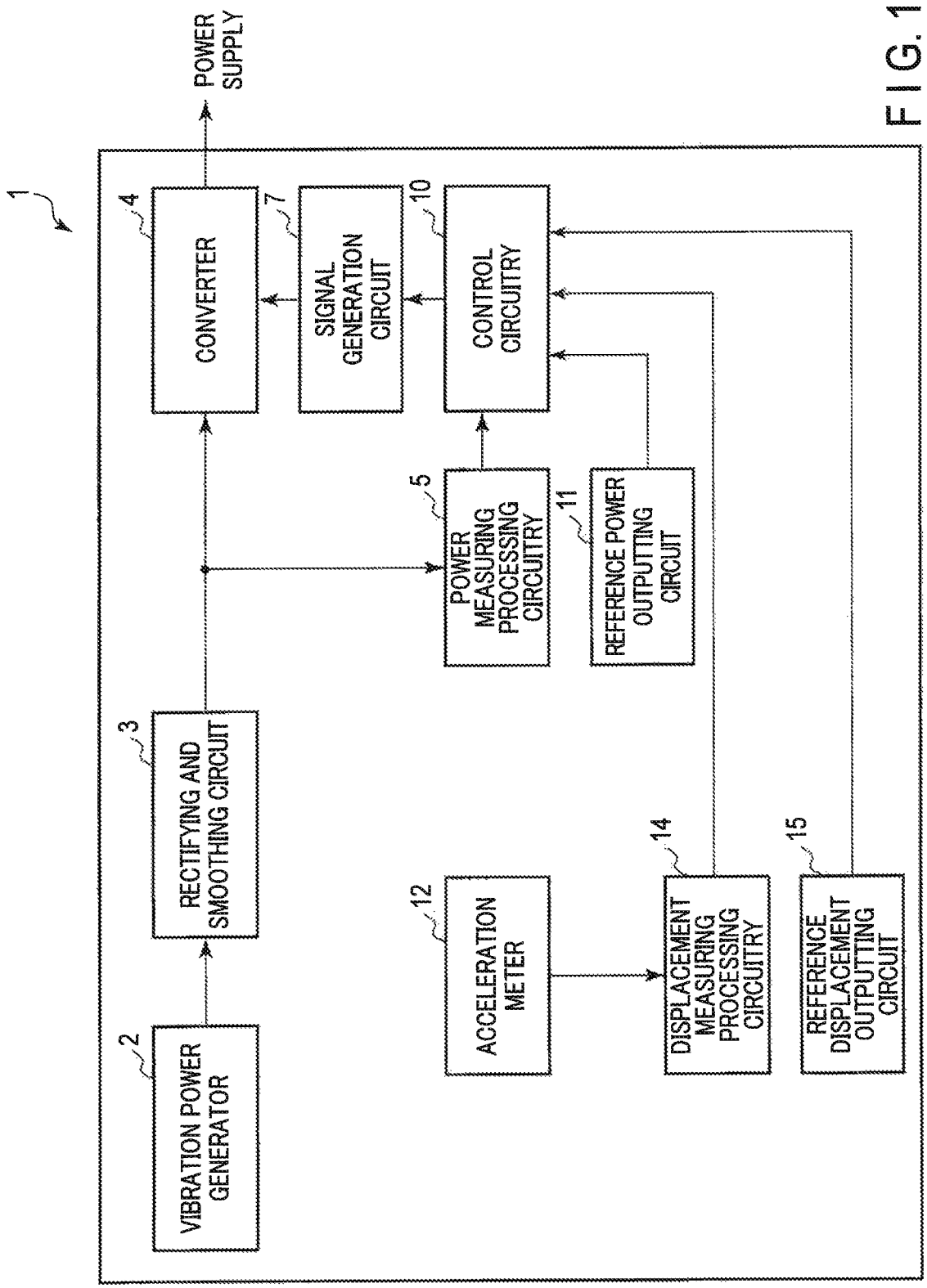
FIG. 16 is a block diagram illustrating a power generation system according to a second modified example of the third embodiment.

FIG. 16 illustrates a power generation system according to a second modified example of the third embodiment. As illustrated in FIG. 16, in addition to the vibration power generator 2, the rectifying and smoothing circuit 3, the converter 4, the power measuring processing circuitry 5, the signal generation circuit 7, the control circuitry 10, the reference power outputting circuit 11, and the acceleration meter 12, the power generation system 1 comprises a displacement measuring processing circuitry 14 and a reference displacement outputting circuit 15.

The displacement measuring processing circuitry 14 includes a digital signal processor such as a CPU, an ASIC, an FPGA, or a DSP. The displacement measuring processing circuitry 14 may also include memory such as DRAM or SRAM. The displacement measuring processing circuitry 14 may also include a plurality of digital signal processors and memories. The displacement measuring processing circuitry 14 measures displacement of a moving part of the vibration power generator 2. For example, the displacement measuring processing circuitry 14 measures displacement of the moving part by integrating acceleration measured by the acceleration meter 12 twice.

The reference displacement outputting circuit 15 includes a memory such as DRAM or SRAM. The reference displacement outputting circuit 15 stores reference displacement. The reference displacement is an upper limit value of displacement of the moving part, for example.

In the second modified example of the third embodiment, the control circuitry 10 increase the switched-ON time $t_{on}$ not only when the current power generated $p_c$ is greater than the reference power $p_{ref}$, but also when the displacement of the current moving part is larger than the reference displacement. An increment of the switched-ON time $t_{on}$ at this time may be greater than the increment of the switched-ON time $t_{on}$ based on the power generated; for example. In this case, even when the ambient acceleration is abruptly increased, the displacement of the moving part may be suppressed rapidly.

In the second modified example of the third embodiment, a power measuring processing circuitry 13 may also be provided. In this case, the power measuring processing circuitry 13 may be configured to determine the reference power stored in the reference power outputting circuit. 11 in accordance with the average power consumption consumed by the load.

Other Modified Examples

In the power generation systems 1 described above, a buck-boost converter is used as an example of the converter 4. However, the techniques of the embodiments and modified examples thereof described above are also able to be applied to a power control circuit that uses a switching converter of any kind for which the equivalent resistance $r_{eq}$ of the circuit as seen from the power generator can be expressed using Equation (10) without regard to the load.

The control circuitry 6 or the control circuitry 10 is configured to cause a switching operation of the switching circuit 4 with the digital signal processor such as CPU, ASIC, FPGA or DSP. In contrast, the control circuitry 6 or the control circuitry 10 may be configured to achieve a switching operation by changing a resistance connected to the switching circuit S by a jumper.

Moreover, the power generator of the power generation systems 1 described above is a vibration power generator. However, the techniques of the embodiments and modified examples thereof described above are also able to be applied to power generation systems of any kind that use maximum power point tracking control for power control, such as solar power generators and wind power generators.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power control circuit, comprising:
   a converter including a switching circuit, and configured to transform an output voltage from a power generator;
   a signal generation circuit configured to operate the switching circuit of the converter;
   control circuitry configured to change an operation of the switching circuit.

2. The power control circuit according to claim 1, wherein
   a condition of the operation of the switching circuit is determined based on an optimum resistance, which corresponds to an equivalent resistance of the power control circuit as seen from the power generator, and also corresponds to the equivalent resistance making power generated from the power generator maximum.

3. The power control circuit according to claim 2, wherein
   the power generator is a vibration power generator configured to convert mechanical vibration of a moving part into electric power, and
   the power control circuit further comprises an acceleration meter configured to measure acceleration of the mechanical vibration, and
   the control circuitry is configured to determine the optimum resistance based on the acceleration measured by the acceleration meter.

4. The power control circuit according to claim 2, wherein
   the power generator is a vibration power generator configured to convert mechanical vibration of a moving part,
   the control circuitry configured to estimate acceleration of the mechanical vibration by applying a reverse characteristic filter to an electric signal output from the power generator and determines the optimum resistance based on the estimated acceleration.

5. The power control circuit according to claim 1, wherein
   the power generator is a vibration power generator configured to convert mechanical vibration of a moving part into electric power.

6. The power control circuit according to claim 1, further comprising:
   first power measuring processing circuitry configured to measure power generated by the power generator; and
   a reference power outputting circuit configured to output reference power, which is a threshold of the power generated by the power generator,
   wherein the control circuitry is configured to control the signal generation circuit based on the power generated by the first power measuring processing circuitry and the reference power measured.

7. The power control circuit according to claim 6, wherein
   the control circuitry is configured to control the signal generation circuit to make the measured power generated equal to or lower than the reference power.

8. The power control circuit according to claim 6, wherein
   the first power measuring processing circuitry is configured to measure the power generated by the power generator based on the output voltage from the power generator and the operation of the switching circuit.

9. The power control circuit according to claim 6, wherein
   the reference power is set based on a threshold of displacement of a moving part.

10. The power control circuit according to claim 6, wherein
    the reference power is set based on power consumption at a load connected to the power generator.

11. The power control circuit according to claim 6, further comprising:
    displacement measuring processing circuitry configured to measure displacement of the moving part; and
    a reference displacement outputting circuit configured to output reference displacement, which is a threshold of displacement of the moving part,
    wherein the control circuitry is configured to control the signal generation circuit based on the displacement measured by the displacement measuring processing circuitry and the reference displacement.

12. A power generation system, comprising:
    the power control circuit according to claim 1; and
    a vibration power generator configured to convert mechanical vibration of a moving part into power.

13. A power control circuit, comprising:
    a converter including a switching circuit, and configured to transform an output voltage from a power generator;
    a signal generation circuit configured to operate the switching circuit of the converter;
    power measuring processing circuitry configured to measure power generated by the power generator based on the output voltage from the power generator and the operation of the switching circuit; and
    a controller configured to control the signal generation circuit so as to maximize the power generated.

14. The power control circuit according to claim 13, wherein
    the controller is configured to maximize the power generated using a hill-climbing method.

15. The power control circuit according to claim 13, further comprising:
    a reference value outputting circuit configured to output a threshold for a parameter for the switching operation; and wherein
    the controller is configured to control the signal generation circuit according to the threshold.

16. The power control circuit according to claim 15, wherein
    the power generator is a vibration power generator configured to convert mechanical vibration of a moving part into power, and
    the threshold is set based on an equivalent resistance of the power control circuit as seen from the power generator when a frequency of the mechanical vibrations matches a natural vibration frequency of the power generator and an oscillatory waveform of the mechanical vibrations is sinusoidal.

17. The power control circuit according to claim 13, wherein
    the power generator is a vibration power generator configured to convert mechanical vibration of a moving part into power, and the power control circuit further comprises
a first rectifying and smoothing circuit configured to convert AC power from the power generator into first DC power and output the first DC power to the power measuring processing circuitry; and
a second rectifying and smoothing circuit configured to convert the first DC power output from the first rectifying and smoothing circuit into second DC power, wherein
the signal generation circuit, the power measuring processing circuitry, and the controller are driven based on the second DC power output from the second rectifying and smoothing circuit.

18. The power control circuit according to claim 13, wherein
the controller is configured to:
calculate a value for an unknown coefficient in a power approximation formula with respect to an equivalent resistance of the power control circuit as seen from the power generator,
calculate an optimum resistance for the equivalent resistance that maximizes the power generated from the calculated value for the unknown coefficient, and
control the signal generation circuit based on the optimum resistance.

* * * * *